(12) United States Patent
Luebben et al.

(10) Patent No.: US 8,097,348 B2
(45) Date of Patent: Jan. 17, 2012

(54) PI-CONJUGATED ORGANOBORON POLYMERS IN THIN-FILM ORGANIC ELECTRONIC DEVICES

(75) Inventors: Silvia DeVito Luebben, Golden, CO (US); Shawn Sapp, Westminster, CO (US)

(73) Assignee: TDA Research, Inc., Wheat Ridge, CO (US)

( * ) Notice: Subject to any disclaimer, the term of this patent is extended or adjusted under 35 U.S.C. 154(b) by 377 days.

(21) Appl. No.: 12/293,372

(22) PCT Filed: Mar. 19, 2007

(86) PCT No.: PCT/US2007/064328
§ 371 (c)(1),
(2), (4) Date: Sep. 17, 2008

(87) PCT Pub. No.: WO2007/109629
PCT Pub. Date: Sep. 27, 2007

(65) Prior Publication Data
US 2009/0127547 A1 May 21, 2009

Related U.S. Application Data

(63) Continuation-in-part of application No. 11/378,619, filed on Mar. 17, 2006, now abandoned.

(51) Int. Cl.
*H01L 51/54* (2006.01)
(52) U.S. Cl. .......... 428/690; 428/917; 257/40; 525/239; 525/389; 528/4
(58) Field of Classification Search .................. 428/690, 428/917; 257/40; 525/239, 389; 528/4
See application file for complete search history.

(56) References Cited

U.S. PATENT DOCUMENTS
3,109,031 A 10/1963 Goldstein et al.
(Continued)

FOREIGN PATENT DOCUMENTS
JP 11-255902 * 9/1999
(Continued)

OTHER PUBLICATIONS

Chujo et al., Poly(p-phenylene-borane) s. Novek Organoboron pi-conjugated Polymers via Grignard Reagent, 1998, J. Am. Chem. Soc. vol. 120, pp. 10776-10777.*

(Continued)

*Primary Examiner* — Jennifer Chriss
*Assistant Examiner* — Gregory Clark
(74) *Attorney, Agent, or Firm* — Greenlee Sullivan P.C.

(57) ABSTRACT

Pi-conjugated organoboron polymers for use in thin-film organic polymer electronic devices. The polymers contain aromatic and or unsaturated repeat units and boron atoms. Pi-conjugated organoboron polymers which are end capped, derivatized with solubilizing groups or both exhibit improved solubility and handling properties beneficial for the formation of thin films useful for device fabrication. The vacant p-orbital of the boron atoms conjugate with the pi-conjugated orbital system of the aromatic or unsaturated monomer units extending the pi-conjugation length of the polymer across the boron atoms. The pi-conjugated organoboron polymers are electron-deficient and, therefore, exhibit n-type semiconducting properties, photoluminescence, and electroluminescence. The invention provides thin-film organic polymer electronic devices, such as organic photovoltaic cells (OPVs), organic diodes, organic photodiodes, organic thin-film transistors (TFTs), organic field-effect transistors (OFETs), printable or flexible electronics, such as radio-frequency identification (RFID) tags, electronic papers, and printed circuit elements, organic light-emitting diodes (OLEDs), polymer light-emitting diodes (PLEDs), and energy storage devices employing the pi-conjugated organoboron polymers. In OLED and PLED applications these materials are used as the electron transport layer (ETL) to improve device efficiency. The polymers which exhibit photo- and electroluminescence are also useful as light-emitting material in PLEDs.

53 Claims, 3 Drawing Sheets

U.S. PATENT DOCUMENTS

| | | | |
|---|---|---|---|
| 3,166,522 | A | 1/1965 | Kitasaki et al. |
| 3,203,909 | A | 8/1965 | Brotherton et al. |
| 3,203,929 | A | 8/1965 | Kitasaki et al. |
| 3,203,930 | A | 8/1965 | Bower |
| 3,269,992 | A | 8/1966 | Green et al. |
| 5,663,573 | A * | 9/1997 | Epstein et al. .................. 257/40 |
| 5,807,905 | A | 9/1998 | Cunningham et al. |
| 6,025,453 | A | 2/2000 | Keller et al. |
| 6,057,078 | A | 5/2000 | Cunningham et al. |
| 6,597,012 | B2 | 7/2003 | Kido et al. |
| 6,767,654 | B2 | 7/2004 | Tamao et al. |
| 7,157,154 | B2 | 1/2007 | Tamao et al. |
| 2004/0109666 | A1 * | 6/2004 | Kim, II ......................... 385/147 |
| 2006/0229431 | A1 | 10/2006 | Kanitz et al. |
| 2007/0215864 | A1 | 9/2007 | Luebben et al. |

FOREIGN PATENT DOCUMENTS

| | | |
|---|---|---|
| WO | WO 2004/099291 | 11/2004 |
| WO | WO 2005/063919 | 7/2005 |
| WO | WO 2005/096402 | 10/2005 |
| WO | WO 2007/109629 | 9/2007 |

OTHER PUBLICATIONS

Babel et al. (Mar. 4, 2002) "Electron Transport in Thin-Film Transistors from an n-Type Conjugated Polymer," *Adv. Mater.* 14:371-374.

Chujo et al. (2000) "Stable Organoboron Polymers Prepared by Hydroboration Polymerization of Diynes with Mesitylborane," *Polymer* 41:5047-5051.

Corriu et al. (1998) "Unsaturated Polymers Containing Boron and Thiophene Units in the Backbone," *Chem. Commun.* :963-964.

Cowie et al. (1993) *Polymers: Chemistry and Physics of Modern Materials*, Blackie Academic and Professional, Great Britain, 2nd ed., pp. 8-11, 187-214.

Fiedler et al. (1996) "Electronic Structure of π-Conjugated Redox Systems with Borane/Borataalkene End Groups," *Inorg. Chem.* 35:3039-3043.

Friend et al. (Jan. 14, 1999) "Electroluminescence in Conjugated Polymers," *Nature* 397:121-128.

Gagnon et al. (Apr. 1987) "Synthesis, Doping, and Electrical Properties of High Molecular Weight Poly(p-phenylenevinylene)," *Polymer* 28:567-573.

Good et al. (1962) "Alkenylboranes. II. Improved Preparative Methods and New Observations on Methylvinylboranes," *J. Am. Chem. Soc.* 84:1162-1165.

Granstrom et al. (Sep. 17, 1998) "Laminated Fabrication of Polymeric Photovoltaic Diodes," *Nature* 395:257-260.

International Search Report and Written Opinion, Corresponding to International Application No. PT/US07/64328, Mailed Jul. 22, 2008.

Jia et al. (2004) "Three Coordinate Organoboron Compounds BAr$_2$R (Ar = Mesityl, R = 7-Azaindolyl- or 2,2'-Dipyridylamino-Functionalized Aryl or Thienyl) for Electroluminescent Devices and Supramolecular Assembly," *Chem. Eur. J.* 10:994-1006.

Jonforsen et al. (2002) "Synthesis and Characterization of Soluble and n-Dopable Poly (quinoxaline vinylene)s and Poly(pyridopyrazine vinylene)a with Relatively Small Band Gap," *Macromolecules* 35:1638-1643.

Kertesz, M. (1997) "Electronic Structure of π-Conjugated Polymers," In; *Handbook of Organic Conductive Molecules and Polymers*, Nalwa, H.S. Ed., Wiley and Sons, Chichester, UK, vol. 4, Ch. 3, pp. 147-172.

Kobayashi et al. (2003) "Electrical Conductivity of π-Conjugated Organoboron Polymers Upon *n*-type Doping," *Synthetic Metals* 135-136:393-394.

Kraft et al. (1998) "Electroluminescent Conjugated Polymers—Seeing Polymers in a New Light," *Angew. Chemie. Int. Ed.* 37:402-428.

Li et al. (1995) "Synthesis and Optoelectronic Properties of Aromatic Oxadiazole Polymers," *J. Chem. Soc. Chem. Commun.* :2211-2212.

Lin et al. (2007) Quantum chemical investigation on one-and two-photon absorption properties for a series of donor-π-acceptor-type compounds with trivalent boron as an acceptor, *Theochem* 820:98-106.

MacDiarmid, L.A. (2001) "Synthetic Metals: A Novel Role for Organic Polymers (Nobel Lecture)," *Angew. Chem. Int. Ed.* 40:2581-2590.

Matsumi et al. (2003) "Ion Conductive Characteristics of Boron Stabilized Carbanion Derived from Organoboron p-Conjugated Systems," *Polymer Bull.* 50:259-264.

Matsumi et al. (1998) "Poly(*p*-phenylene-borane)s. Novel Organoboron π-Conjugated Polymers Via Grignard Reagent," *J. Am. Chem. Soc.* 120:10776-10777.

Matsumi et al. (1998) "Extensions of π-Conjugation Length Via the Vacant p-Orbital of the Boron Atom. Synthesis of Novel Electron Deficient π-Conjugated Systems by Hydroboration Polymerization and Their Blue Light Emission," *J. Am. Chem. Soc.* 120:5112-5113.

Matsumi et al. (1999) "Synthesis of Organoboron π-Conjugated Polymers by Hydroboration Polymerization Between Heteroaromatic Diynes and Mesitylborane and Their Light Emitting Properties," *Macromolecules* 32(13):4467-4469.

Matsumi et al. (2002) "Novel π-conjugated Organoboron Polymers: Poly(ethynylene-phenylene-ethynylene-borane)s," *Polymer Bull.* 44:431-436.

Miyata et al. (1999) "Synthesis of π-Conjugated Organoboron Polymers by Haloboration-phenylboration Polymerization of Aromatic Diynes," *Polymer Bull.* 42:505-510.

Moliton, A. (1998) "Ion Implantation Doping of Electroactive Polymers and Device Fabrication," In, *Handbook of Conducting Polymers*, Skotheim et al. Eds., Marcel Dekker, New York, 2nd Ed., pp. 589-638.

Nagata et al. (2007) "Organoboron Polymers," In; Macromolecules Containing Metal and Metal-Like Elements, Abd-El-Aziz et al. Eds., vol. 8, Chapter 4, 121-147 (Wiley Interscience).

Nagata et al. (2007) "Main-Chain Organoboron Quinolate Polymers: Synthesis and Photoluminescence Properties," *Macromolecules* 40:6-8.

Noda et al. (1998) "5,5'-Bis(dimesitylboryl)-2,2'-bithiophene and 5-5''-Bis9dimesitylboryl)-2,2':5',2''-terthiophene as a novel Family of Electron-Transporting Amorphous Molecular Materials," *J. Am. Chem. Soc.* 120:9714-9715.

O'Brien et al. (Aug. 12, 1996) "Use of Poly(phenyl quinoxaline) as an Electron Transport Material in Polymer Light-Emitting Diodes," *Appl. Phys. Lett.* 69:881-883.

Pelter et al. (1979) "Triorganylboranes," In; *Comprehensive Organometallic Chemistry*, vol. 3, pp. 792-795.

Sato et al. (Sep. 2005) "Studies on electrical transport properties of a novel n-type polymer containing tripylborane and fluorine moieties," *Synthetic Metals* 154:113-116.

Shacklette et al. (1985) "Polyacetylene and Polyphenylene as Anode Materials for Non-Aqueous Secondary Batteries," *J. Electrochem. Soc.* 132:1529-1535.

Shaheen et al. (Feb. 5, 2001) "2.5% Efficient Organic Plaster Solar Cells," *Appl. Phys. Lett.* 78:841-843.

Sherf, U. (1998) "Conjugated Ladder-Type Structures," In; *Handbook of Conducting Polymers*, Skotheim et al. Eds., Marcel Dekker, New York, 2nd ed., pp. 363-379.

Smith et al. (2001) "Delocalized Chemical Bonding," In; *March's Advanced Organic Chemistry, Delocalized Chemical Bonding*, John Wiley and Sons. 5th ed., pp. 32-49.

Strohriegl et al. (2002) "Charge-Transporting Molecular Glasses," *Adv. Mater.* 14:1439-1451.

Sundararraman et al. (Oct. 2005) "A Family of Main-Chain Polymeric Lewis Acids: Synthesis and Fluorescent Sensing Properties of Boron-Modified Polythiophenes," *J. Am. Chem. Soc.* 127:13748-13749.

Tonzola et al. (Aug. 2002) "New Soluble n-Type Conjugated Copolymer for Light-Emitting Diodes," *Adv. Mater.* 14(15):1086-1088.

Yamamoto et al. (1975) "Carbon-13 Nuclear Magnetic Resonance Studies of Organoboranes. Relative Importance of Mesomeric Boron-Carbon .pi.-Binding forms in Alkenyl- and Alkynylboranes," *J. Org. Chem.* 40:3434-3437.

Yuan et al. (2000) "Linear and Nonlinear Optical Properties of Three-Coordinate Organoboron Compounds," *J. Solid State Chem.* 154:5-12.

Zweifel et al. (1976) "Spectral Properties of Alkenylboranes. Evidence for Conjugative Interactions of Boron with Carbon-Carbon π-Systems," *J. Organomet. Chem.* 117:303-312.

* cited by examiner

PI-CONJUGATED ORGANOBORON POLYMERS IN THIN-FILM ORGANIC ELECTRONIC DEVICES

CROSS-REFERENCE TO RELATED APPLICATIONS

This application is the U.S. National Stage of International Application No. PCT/US2007/064328, filed Mar. 19, 2007, which is a continuation in part and claims the benefit of U.S. application Ser. No. 11/378,619, filed Mar. 17, 2006, now abandoned, each of which is incorporated by reference herein in its entirety.

STATEMENT REGARDING FEDERALLY SPONSORED RESEARCH OR DEVELOPMENT

This invention was made, at least in part, with funding from the National Science Foundation contracts DMI-0319320 and OII-0539625. The United States government has certain rights in the invention.

BACKGROUND OF THE INVENTION

This invention relates to pi-conjugated (or π-conjugated) organoboron polymers and their use in thin film electronic devices. The invention further relates to methods for the fabrication of such devices as well as to methods of preparation of certain pi-conjugated organoboron polymers having improved solubility and stability. Pi-conjugated organoboron polymers are of interest because of their opto-electronic properties and are useful in thin-film plastic electronic devices, such as organic thin film transistors (TFTs), organic light emitting diodes (OLEDs), printable circuits, organic supercapacitors and organic photovoltaic (OPV) devices The specific functions of many electronic components and devices arise from the unique interactions existing between p-type and n-type conducting and semiconducting materials. Until a few years ago, inorganic conductors and semiconductors entirely dominated the electronic industry. In recent years there has been a major worldwide research effort to develop conducting and semiconducting organic compounds and polymers, and to use them to fabricate plastic electronic devices, such as organic thin film transistors (TFTs), organic light emitting diodes (OLEDs), printable circuits, organic supercapacitors and organic photovoltaic devices. Plastic electronic components offer several potential advantages over traditional devices made of inorganic materials; they are flexible and can be manufactured by inexpensive ink-jet printing or roll-to-roll coating technologies.

Intrinsically conducting polymers (ICPs) are polymers with extended π conjugation along the molecular backbone, and their conductivity can be changed by several orders of magnitude by doping. P-doping is the partial oxidation of the polymer by a chemical oxidant or an electrode which causes depopulation of the bonding π orbital (HOMO) with the injection of "holes". N-doping is the partial reduction of the polymer by a chemical reducing agent or electrode with the injection of electrons in the antibonding π system (LUMO, MacDiarmid A., *Angew. Chem. Int. Ed.*, 40, 2581-2590, 2001). The doping process incorporates charge carriers (either electrons or holes) into the polymer backbone, and as a result the polymer becomes electrically conducting to a level that is commensurate with its doping level.

An equally important class of electronic polymers is the conjugated semiconducting polymers. These polymers, like ICPs, are able to support the injection of p-type or n-type charge carriers; however the charge carriers are often few in number and are transient species that ultimately decay or are transferred to a different material. Some ICPs function as semiconducting polymers in their undoped state, however other ICPs are not stable in their semiconducting state. Electrical conductivity and work function are the key parameters for characterizing ICPs, while charge carrier density and mobility, and energy levels are the key parameters for characterizing semiconducting polymers. One special class of semiconducting polymers is the group of light emitting polymers. These polymers are also able to support the injection and transport of both positive and negative charges (although one carrier is often preferred). When holes and electrons recombine within the electroluminescent material, a neutral excited species (termed an exciton) forms that decays to the ground state, liberating energy in the form of light (Salaneck, W. R. et al., *Nature*, 397, 121-128, 1999).

Thus, certain pi-conjugated polymers are well known to possess semiconducting properties which are due to the formation of interconnected molecular orbitals along the pi-bonding and pi-antibonding structure of the conjugated backbone. Charges that are introduced onto such polymer chains (either by addition or removal of an electron) are free to travel over a certain distance along the polymer chain giving rise to semiconducting properties. The number of charges that can be injected, the ease of introducing charges, the distance that a charge can travel (mobility), and the type of charge (positive holes or negative electrons) that is more favorable depend upon the electronic properties of the polymer. By careful design of the structure, a polymer that favors electrons (called an n-type semiconductor) or holes (called a p-type semiconductor) as the dominant form of charge carrier can be selected. This is done through introduction into the polymer of selected atoms, organic groups and/or substituent groups based on their electron-donating or electron-withdrawing properties. Appropriate selections of atoms or chemical groups for introduction into the polymer structure lead to a conjugated polymer structure that is either electron-rich or electron-deficient. Electron-rich polymer structures have p-type semiconducting properties and electron-deficient polymer structures have n-type semiconducting properties.

Most pi-conjugated hydrocarbon polymers such as polyacetylene, poly(phenylenevinylene), poly(paraphenylene), polyfluorenes and their derivatives readily support the injection of both electrons and holes (the respective n-type and p-type charge carriers). In fact, theoretical calculations show that for certain hydrocarbon conjugated polymers such as poly(paraphenylene) there is a perfect electron-hole symmetry [i.e. the frontier orbitals of positively and negatively charged carriers are fully symmetrical], indicating that electron and hole conduction are equally favorable processes (Kertesz, M. in *Handbook of Organic Conductive Molecules and Polymers*, Vol. 4, Ed. Hari Singh Nalwa, J. Wiley & Sons, Chichester, UK, p. 163, 1997). This symmetry can be broken by introducing atoms other than carbon (heteroatoms, i.e., O, N, S, etc.), organic groups and/or substituent groups that are either electron-rich or electron-deficient, thus favoring either the injection of holes or electrons, respectively. It is generally easier to design electron-rich conjugated polymers than electron-deficient conjugated polymers. An electron-rich polymer can be created by appropriate introduction of an electronegative heteroatom, such as sulfur, nitrogen or oxygen into the conjugated polymer. A variety of chemistries are available in the art for introducing electro-negative heteroatoms into such polymers. As a result a large number of p-type conducting polymers have been developed and characterized over the past two decades. Furthermore, many p-type conducting and semiconducting polymers have been used in commercial devices and are successfully competing with conventional inorganic semiconductors and conductors.

In contrast, it is more difficult to design electron-deficient conjugated polymer systems. Most of the polymers currently used as n-type semiconductors are hydrocarbon-based polymers [especially poly(phenylenevinylene)] carrying electron-withdrawing substituents such as cyano or nitro groups (Friend, R. H. et al. *Nature,* 395, 257-259, 1998; Holmes et al. *Angew. Chemie. In. Ed.,* 37, 402-428, 1998), polymers containing oxadiazole, quinoxaline, or pyridine units (Bradley, et al. *Appl. Phys. Lett.,* 69, 881-883, 1996; Holmes et al. *Angew. Chemie. In. Ed.,* 37, 402-428, 1998; Andersson et al. *Macromolecules,* 35, 1638-1643, 2002), and a few ladder polymers such as BBL ({poly(7-oxo,10H-benz[de]imidazo[4',5:5,6]-benzimidazo[2,1-a]isoquinoline-3,4:10,11-tetrayl)-10-carbonyl}) (Sherf, U. "Conjugated Ladder-Type Structures," in *Handbook of Conducting Polymers, $2^{nd}$ Ed.*". Ed. T. A. Skotheim, R L Elsenbauer, J. R. Reynolds, Marcel Dekker, New York, 363-379, 1998). Unfortunately, current n-type semiconducting polymers have generally poor properties, including low charge carrier density and low carrier mobility. Furthermore, most of these materials are difficult to process, and some of them are difficult to synthesize.

In some cases, n-type semiconducting non-polymeric species, such as functionalized fullerenes, molecular glasses and metal complexes, are used instead of polymers (Strohriegl, P. et. Al, *Advanced Materials,* 14, 1439-1451, 2002; Shaheen, S. et. al., *Appl. Phys. Lett.,* 78, 841-843, 2001). The disadvantage of these non-polymeric semiconducting species is the low charge carrier mobility due to the limited conjugation (due to low molecular weight), and the fact that they often need to be processed by vacuum deposition techniques. Thus, there is a significant need in the art for new n-type conducting and semiconducting materials having improved charge carrier mobility, which are more readily synthesized and processed. The present invention provides n-type semiconducting polymers which provide such improvements.

There are two basic ways to make a pi-conjugated polymer structure that is electron deficient. First, as noted above, the conjugated backbone of the polymer can be chemically modified by substitution with electron withdrawing substituent groups, such as cyano or nitro groups. Such pendant modification is effective to impart some electron deficiency to the pi-conjugated polymer. For example, poly(para-phenylene vinylene) has been modified with cyano and other pendant groups to produce a pi-conjugated semiconducting polymer with n-type properties (Granstrom et al. *Nature* 395, 257-260, 1998). A second and more effective way to impart n-type semiconducting properties is to directly modify the backbone of the polymer with electron deficient atoms or organic structures. Holmes et al. prepared pi-conjugated oxadiazole-containing polymers that exhibited n-type semiconducting properties and photoluminescence (Li et al. *J. Chem. Soc. Chem. Commun.* 2211-2212, 1995). Yamamoto et al. prepared pi-conjugated quinoxaline-containing polymers that also exhibited n-type semiconducting properties, photoluminescence, and electroluminescence. Both the oxadiazole and quinoxaline structures are known to impart electron deficiency in molecules. Similarly, Babel and Jenekhe. prepared pi-conjugated polymers incorporating regioregular dioctylbithiophene and bis(phenylquinoline) units in the backbone of the polymer and demonstrated both PLED (polymer light-emitting diodes) and OFET (organic field-effect transistors) prototype devices utilizing these materials (Babel, A., Jenekhe, S. A. *Adv. Mater.,* 14, 371-374, 2002).

Certain non-polymeric, pi-conjugated, organoboron molecules have been observed to be electron deficient (Noda et al. *J. Am. Chem. Soc.* 120, 9714-9715, 1998; Matsumi et al. *Polymer Bulletin* 50, 259-264, 2003). This is due to the valence electronic structure of the boron atom and its ability to form multiple stable bonds with carbon atoms. The empty p-orbital of boron can join in the pi-conjugated system without any added electron density (Zweifel et al. *J. Organomet. Chem.* 117, 303-312, 1976). The possibility of delocalization of pi electrons between the vacant p orbital of boron and the pi orbitals of conjugated organic substituents has been extensively studied on mono- and di-vinylhaloboranes and trivinylborane. These molecules exist only in a planar conformation, suggesting that there is, in fact, delocalization of the vinyl pi electrons over the boron atom (Pelter, A., and Smith, K. "Triorganylboranes," in *Comprehensive Organometallic Chemistry,* Vol 3, 792-795, 1979). Theoretical calculations performed with the LCAO and self-consistent field methods (Good, C. D., and Ritter, D. M. *J. Am. Chem. Soc.,* 84, 1162-1165, 1962) as well as $^{13}$C-NMR studies (Yamamoto, Y. and Moritani, I. *J. Org. Chem.,* 40, 3434-3437, 1975) also predict considerable delocalization of the vinyl pi electrons over the carbon-boron bonds.

Marder et al. report that three-coordinate boron species are equivalent to carbonium ions, and are thus extremely electron-deficient systems. However, if the boron is sterically protected, for example, with bulky trimethylphenyl groups, the resultant materials are air-stable (Marder et al. *J. of Solid State Chemistry,* 154, 5-12, 2000). Kaim and co-workers report that low molecular weight, non-polymeric, pi-conjugated organoboron compounds having redox properties that are analogous to nitrogen-containing pi-conjugated molecules. In fact, under chemical or electrochemical reduction, organoboron compounds form a series of anions of the type: —$BR_2$, —$BR_2^-$, =$BR_2^-$, while nitrogen-containing compounds upon oxidation form the series of cations: —$NR_2$, —$NR_2^{·+}$, =$NR_2^+$ (Fiedler et al. *Inorg. Chem.,* 35, 3039-3043, 1996). This indicates that pi-conjugated organoboron compounds are redox active and are effectively easy to reduce. The use of certain organoboron, non-polymeric pi-conjugated molecules as an electron transport layer (ETL) in molecular organic light-emitting diodes is reported by Shirota and Noda. These authors report an improvement in maximum luminescence by a factor of 1.6 to 1.8 compared to an identical single layer device that does not contain the organoboron ETL (Shirota Y. and T. Noda *J. Am. Chem. Soc.,* 120, 9714-9715, 1998). The organoboron ETL materials of Shirota and Noda are non-polymeric molecules of defined structure having a specific molecular weight and are not pi-conjugated organoboron polymers.

Chujo and co-workers reported a number of pi-conjugated, organoboron polymers wherein the boron atoms of the polymer backbone are substituted with bulky aromatic groups such as 2,4,6-trimethylphenyl(mesityl) or 2,4,6-triisopropylphenyl(tripyl) (Matsumi et al. *J. Am. Chem. Soc.,* 120, 10776-10777, 1998; Matsumi et al. *J. Am. Chem. Soc.,* 120, 5112-5113, 1998; Matsumi et al. *Macromolecules,* 32, 4467-4469, 1999; Matsumi et al. *Polymer Bulletin,* 44, 431-436, 2000, Chujo et al. *Polymer,* 41, 5047-5051, 2000). The authors concluded that the bulky protecting groups on boron led to stable non-conjugated polymers with weight average molecular weights that remained stable with constant exposure to air for two weeks (Chujo et al. *Polymer* 41, 5047-5051, 2000). Chujo and coworkers also prepared pi-conjugated, organoboron polymers wherein the boron atoms of the polymer backbone are substituted with phenyl groups (Miyata et al. *Polymer Bulletin,* 42, 505-510, 1999), or bonded to a quinolate moiety (Nagata et al. *Macromolecules*, 40, 6-8, 2007.) These polymers have absorption maxima in the visible region and are highly fluorescent when irradiated with UV light, suggesting the existence of an extended π-conjugation across the boron atoms. The polymers are also soluble in common organic solvents and stable in air and moisture in the pristine (undoped) state. Chujo and co-workers have also reported the n-doping of a pi-conjugated, organoboron polymer with triethylamine to a conductivity of $10^{-6}$ S/cm (Kobayashi et al. *Synthetic Metals*, 135-136, 393-394, 2003). The n-type semiconducting properties and photoluminescence of these materials have been reported, but the materials were not shown to be useful in thin film, organic polymer electronic devices, such as OPVs (organic photovoltaics), PLEDs, or OFETs.

Jäkle reported boron-modified polythiophenes for use in chemical sensors wherein the boron atoms of the polymer backbone are substituted with 4-isopropylphenyl, pentafluorophenyl, and ferrocenyl groups (Sundararraman, et al., *J. Am. Chem. Soc.*, 127, 13748-13749, 2005.) Siebert and coworkers reported the synthesis of certain pi-conjugated organoboron polymers containing thiophene units by a hydroboration polymerization (Corriu et al., *Chem. Commun.* 963-964 1998).

U.S. Pat. Nos. 3,269,992, 3,203,909, 3,203,930, 3,203,929, 3,166,522, and 3,109,031 report the preparation of certain non-conjugated organoboron polymers. U.S. Pat. No. 6,025,453 reports polymers containing at least an alkynyl group, at least one silyl group and at least one boranyl group and their use for making high temperature oxidatively stable thermosetting plastics.

Kanitz et al. report non-conjugated polymeric perarylated borane copolymers and their uses (published US Patent application 2006/0229431 A1; PCT Application WO 2005/063919 and WO 2006/0229431). Cunningham et al. (U.S. Pat. No. 6,057,078) report certain polyborane and polyborate photoinitiators.

SUMMARY OF THE INVENTION

This invention relates to certain pi-conjugated polymers and their use in thin-film organic polymer electronic devices. These polymers all contain boron atoms in the pi-conjugated backbone of the polymer and therefore are electron-deficient and exhibit n-type semiconducting properties, photoluminescence, and/or electroluminescence.

The invention provides thin-film, organic polymer electronic devices which comprise at least one active layer containing a thin film of a pi-conjugated organoboron polymer and at least two electrodes in contact with the active layer. The thin film of the pi-conjugated organoboron polymer can be 100 angstroms to 10,000 angstroms in thickness. Preferably the thin film of the pi-conjugated organoboron polymer is 100 angstroms to 3,000 angstroms in thickness.

The devices of this invention include those which exhibit current rectification or diode-like properties. The devices of this invention include those wherein the thin film comprises a pi-conjugated organoboron polymer that emits light under a voltage bias.

The invention also provides devices wherein the active layer of the device contains, in addition to the thin film of the pi-conjugated organoboron polymer, a light-emitting thin film which comprises a light-emitting polymer which is not a pi-conjugated organoboron polymer, a light-emitting non-polymeric molecule, or an inorganic light emitting compound.

The invention further provides devices having an active layer which comprises at least one thin film that in turn comprises one or more pi-conjugated organoboron polymers blended with one or more light-emitting molecules, or polymers or an inorganic compound.

The invention provides devices having an active layer comprising at least one thin film of a pi-conjugated organoboron polymer blended with a different organic or inorganic conducting or semiconducting material. This organic or inorganic conducting or semiconducting material may be one or more polymers, one or more non-polymeric molecules, one or more inorganic compounds, or a mixture thereof. More particularly, the active layer of the devices herein can comprise at least one thin film containing a p-type conducting or semiconducting polymer that is not a pi-conjugated organoboron polymer blended with a pi-conjugated organoboron polymer. In other embodiments, the active layer of the devices herein comprises at least one thin film containing inorganic p-type semiconducting particles mixed with a pi-conjugated organoboron polymer. More specifically, inorganic p-type semiconducting particles having at least one dimension less than 1000 angstroms can be employed in active layers herein. Regioregular poly(n-alkyl thiophene)s are examples of organic p-type semiconducting materials and boron-doped silicon, p-type gallium arsenide and p-type zinc telluride are examples of inorganic p-type semiconductors that can be used in this invention.

Devices of this invention further include those wherein the active layer further comprises a second thin film of a dielectric insulating material that is in contact with one or more additional electrodes. The layer of dielectric insulating material is usually in contact with one of the electrodes as exemplified in FIGS. 2E and 2F.

Representative structures of organoboron polymer compositions useful in the devices of this invention are shown in Schemes 2A, 2B, 3, 4, 5, 8, 10. Representative synthetic methods are shown in the Examples.

The invention also provides certain novel pi-conjugated organoboron polymers which exhibit beneficial properties for application in thin-film organic polymer electronic devices.

Polymers of this invention include pi-conjugated organoboron polymers and that do not contain an aromatic ring in the polymer backbone. Such polymers may, however, contain one or/more aromatic rings in a side chain, as substituents on the boron atoms or as substituents of the unsaturated carbon atoms of the polymer backbone. Polymers of this invention include, among others, poly(vinylborane)s, poly(acetylenylborane)s, poly(divinylborane)s, poly(vinyl acetylenylborane)s, and poly(polyenylborane)s. Representative structures of these organoboron polymer compositions useful in the devices of this invention are shown in Scheme 2A, formulas a, f and g and Scheme 2B formulas a, f and g. More specific structures of novel organoboron polymers of this invention are shown in Scheme 3, formula D. Representative synthetic methods for these polymers are shown in Example 2. Polymers of this invention can exhibit improved properties over prior art polymers, particularly those reported by Chujo and coworkers, because the higher density of boron atoms can provide higher electron-deficiency.

Polymers of this invention also include poly(9,9-dialkylfluorenylborane)s. Examples of these polymers include polymers 3dx, 3dy, 3ex, 3ey, and 3gx of Scheme 4. Representative synthetic methods for making these polymers are provided in Example 1. These polymers exhibit improved properties compared to known polymers because of their specific light emitting properties (color and intensity).

Polymers of this invention further include structures E, F, G, H, and I of Scheme 3. Representative synthetic methods for making these novel polymers are given in Example 7. These polymers can provide improved properties compared to known polymers because of the higher electron deficiency of the aromatic unit.

Methods or improved methods for synthesis of certain pi-conjugated organoboron polymers are also provided. A significant improvement of the method of preparation of poly (arylborane)s polymers 3a-3e of Scheme 10 in Example 1 over prior art methods is the use of an organolithium derivative rather than a Grignard reagent and the use of cyclohexane (a cyclic hydrocarbon) rather than tetrahydrofurane (THF) or other oxygenated solvent. The improved methods provide polymers having boron atoms that are free from coordination, while prior art methods provide polymers having the boron atoms coordinated to the solvent. Coordination of boron atoms with the solvent partially fills the empty p orbital of the boron atoms and decreases the electron-deficiency of the polymer.

In another aspect, the invention provides end-capped pi-conjugated organoboron polymers that have improved solubility and handling properties compared to equivalent pi-conjugated organoboron polymers that are not end-capped. Examples of end-capped pi-conjugated orgaoboron polymers are shown in Scheme 2B formulas a-j, Scheme 4 formulas A and B and Scheme 5 formulas C-G. The invention further provides methods of preparation of such end-capped polymers.

The invention is based at least in part on the discovery that end-capping of such polymers improves the solubility properties of the polymers, such that they remain soluble in selected solvent after repeated purification cycles. In preferred embodiments, end-capped pi-conjugated organoboron polymers are soluble at a level of 1 gr/L or more in an organic solvent that is useful for making thin films. In more preferred embodiments, end-capped pi-conjugated organoboron polymers are soluble at a level of 10 gr/L or more in an organic solvent that is useful for making thin films. In some cases the equivalent pi-conjugated organoboron polymers that are not end-capped form insoluble material during extensive purification. Polymers that are soluble at a level of 10 g/L or more in a selected organic solvent (particularly those solvents listed in paragraph below are particularly useful for the fabrication of organic thin-film electronic devices, while polymers soluble at level of 1 g/L or less in such organic solvents are less useful or not useful for making thin films. End-capping of such polymers provides polymeric materials having improved utility for the fabrication of thin-film electronic devices.

This invention, thus, provides a method for reducing or eliminating the reactive groups that remain at the end of the growing pi-conjugated organoboron polymer chains when the polymerization reaction stops. End-capped pi-conjugated organoboron polymers according to this invention are soluble after repeated purification cycles, preferably at least four purification cycles. It is believed that polymer solubility is detrimentally affected through cross-linking reaction of the reactive polymer end groups. End-capping reduces or eliminates such cross-linking and provides improved polymers. Methods or improved methods for synthesis of certain end-capped pi-conjugated organoboron polymers are also provided in Examples 8, 10 and 13.

The invention also provides certain novel end capped, pi-conjugated organoboron polymers. Representative structures of end-capped pi-conjugated organoboron polymers of this invention are provided in Scheme 2B. The invention also provides polymer mixtures and blends in which an end-capped pi-conjugated organoboron polymer is combined, mixed or blended with one or more useful polymers which are not end-capped pi-conjugated organoboron polymers. The invention also relates to polymer mixtures and blends in which an end-capped pi-conjugated organoboron polymer is combined, mixed or blended with one or more useful polymers which are not pi-conjugated organoboron polymers. The invention also provides thin films comprising end-capped pi-conjugated organoboron polymers, methods of making such thin films, organic polymer electronic devices as described above containing such thin films and methods of making such devices employing such thin films.

In a specific embodiment, the invention provides a method for making thin films comprising one or more organoboron polymers which comprises the step of reacting a organoboron polymer without end groups with an end capping agent to form an end-capped polymer, and dissolving the end-capped polymer in a solvent useful for making thin films, for example to form a coating solution which can be employed to form the thin film. The end capping agent reacts with polymer ends to form non-reactive end groups on the polymer. The end capping agent is a reactive species that is different in structure and/or reactivity from any of the monomers that are used to form the organoboron polymer. In other embodiments, a mixture of polymers including an end-capped organoboron polymer is dissolved in the solvent to form a thin film. More specifically the methods involves an initial step of forming an organoboron polymer, for example an organoboron polymer of Scheme 2A, followed by a step of reacting the polymer with the end-capping reagent to form an end-capped polymer. In specific embodiments, the end-capped polymer is thereafter purified, for example, by washing, continuous extraction or other methods disclosed herein or known in the art. In specific embodiments, the end-capped organoboron polymer is soluble in an organic solvent useful for thin film formation and in more specific embodiments the end-capped organoboron polymer is soluble at a level of 10 g/L or more in the solvent. In specific embodiments, the solvent is selected from alkanes, aromatic hydrocarbons, ethers, alcohols, ketones, esters, nitriles, lactones, nitroalkanes, halogenated alkanes, and supercritical carbon dioxide. More preferred solvents are benzene, chlorobenzene, toluene, xylenes, pentane, hexanes, cyclohexane, tetrahydrofuran, dimethylformamide, dimethylsulfoxide, N-methylpyrrolidone, dimethylcarbonate, acetonitrile, chloroform, dichloromethane, dichloroethane. Thin films are formed employing any of the various methods known in the art.

The invention additionally provides methods employing thin-film organic polymer electronic devices that contain an active layer comprising one or more end-capped pi-conjugated organoboron polymers, alone or in combination with other useful polymers, for use in photovoltaic cells, diodes, photodiodes, TFTs, organic field effect transistors (OFETs), printable or flexible electronics like radio-frequency identification (RFID) tags, electronic papers, printed circuit elements, OLED)s, polymer light emitting diodes (PLEDs), and energy storage devices.

In yet another aspect, the invention provides improved pi-conjugated organoboron polymers which carry solubilizing groups (e.g., alkyl or ether groups attached to an aromatic group, such as a phenyl group) bonded to one or more boron atoms in the polymer backbone. The solubilizing group facilitates solubility of the polymer in one or more organic solvents useful for the preparation of thin films. IN specific embodiments, all of the boron atoms of the polymer carry the solubilizing group. These derivatized polymers are optionally, but preferably, also end-capped. These derivatized pi-conjugated organoboron polymers exhibit improved solubility and handling properties. The invention also provides polymer mixtures and blends comprising these derivatized polymers. Polymer mixtures and blends of this invention include those in which the pi-conjugated organoboron polymer represents from 1% to 99% by weight of the mixture or blend. Polymer mixtures and blends of this invention include those in which the pi-conjugated organoboron polymer represents from 10% to 90% by weight of the mixture or blend. Polymer mixtures and blends of this invention include those in which the pi-conjugated organoboron polymer represents from 25% to 99%, from 50% to 99% and from 75% to 99% by weight of the mixture or blend. This invention further provides thin films comprising these derivatized organoboron polymers, methods of making such thin films, organic polymer electronic devices, as described above, containing such thin films and methods of making such devices employing such thin films.

Additional aspects and embodiments of the invention will be apparent in view of the drawings, detailed description and examples that follow.

DETAILED DESCRIPTION OF THE INVENTION

Figure 1:
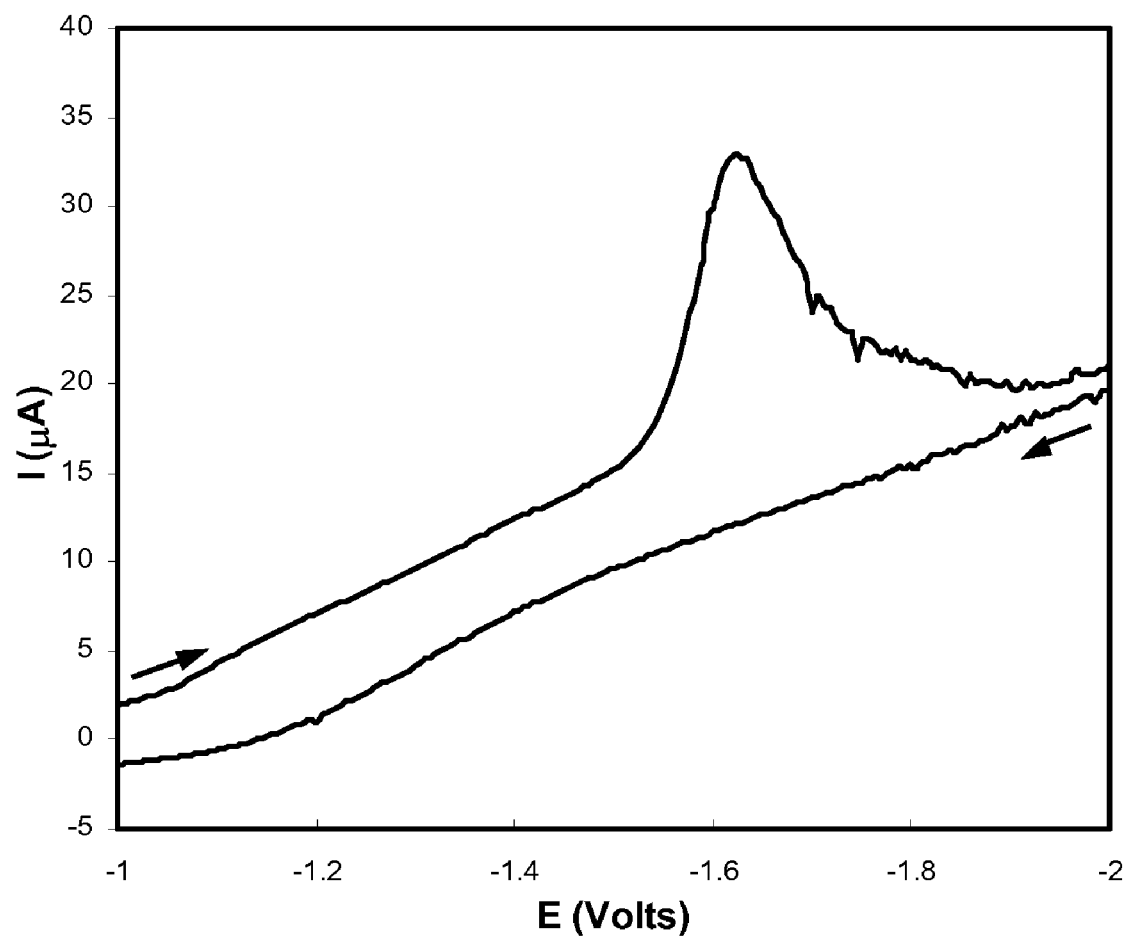
FIG. 1. Cyclic voltammetry of a thin film of polymer 3ay. Arrows indicate direction of the voltage sweep.

This invention relates to the use of pi-conjugated organoboron polymers comprising both organic conjugated repeat units and organoboron units in thin-film, organic polymer, electronic devices. The invention additionally relates to certain novel pi-conjugated organoboron polymers and particularly to pi-conjugated organoboron polymers that exhibit improved solubility and handling properties. More specifically, the invention relates to end-capped pi-conjugated organoboron polymers and to pi-conjugated organoboron polymers derivatized with solubilizing groups and their use in thin-film organic polymer electronic devices. These polymers all contain boron atoms in the pi-conjugated backbone of the polymer and preferably exhibit one or more of the following properties: n-type semiconducting properties, photoluminescence, and electroluminescence.

The following definitions are used herein:

An individual polymer molecule is a molecule comprising a plurality of repeating units. For clarity herein, a polymer molecule is broadly defined herein as containing two or more repeating units of the same type, or two or more repeating units of at least one type of repeating unit, if different repeating units are presents. The two repeating units in a polymer molecule need not be contiguous in the molecule. (This definition of polymer molecules encompasses molecules having small numbers of repeating units which are often called oligomers.) Different repeating units can be distributed in an ordered or random (non-ordered) fashion in the polymer molecule. Polymer molecules are thus distinguished from non-polymeric molecules which do not contain repeating units. A polymer molecule may comprise a linear chain of two or more repeating units or may comprise branched chains of two or more repeating units. Polymer molecules optionally contain end groups that differ in structure and chemistry from the repeating units.

In general, because of the way that they are prepared, polymers are a mixture of polymer molecules comprising a statistical distribution of individual polymer molecules which contain a different number of repeating units, or a different ordering of more than one repeating unit. Each individual polymer molecule in the polymer has a specific chemical structure and molecular weight. However, the polymer is a mixture of individual polymer molecules. Unless otherwise specified herein the term polymer refers to such mixtures of individual polymer molecules.

Therefore polymers (mixtures of individual polymer molecules) are characterized by their "weight average molecular weight," also called "weight average molar mass" that is defined as:

$$<M>_w = (\Sigma w_i M_i)/(\Sigma w_i),$$

where $<>$ indicates that it is an average, $$w_i = N_i M_i / N_A,$$

where $N_i$ is the number of molecules of the polymer i having molar mass $M_i$. [J. M. G. Cowie, "Polymers: Chemistry & Physics of Modern Materials", $2^{nd}$ Edition, Blackie Academic & Professional, Great Britain, (1993), pages 8-9]. The weight average molecular weight is typically measured by Gel Permeation Chromatography (also called size exclusion chromatography) using either a light scattering or a refractive index detector, using appropriate standards of known mass [J. M. G. Cowie, "Polymers: Chemistry & Physics of Modern Materials", $2^{nd}$ Edition, Blackie Academic & Professional, Great Britain, (1993), pages 210-214]. The chain length of polymers can also be described by the "average degree of polymerization $x_w$" where $x=<M>_w/M_0$, where $M_0$ is the molar mass of a monomer (repeating unit) and $<M>_w$ is the weight average molar mass as defined above. As known in the art, polymers may also be characterized by a "number average molecular weight" or the "z-average" both of which are terms that are well-known in the art.

According to this invention polymers encompass oligomeric and telomeric molecules and any mixtures containing a distribution of polymer molecules having the same two or more repeating units, but having different molecular weights or having a different ordering of repeating units. In specific embodiments, polymers of this invention include those in which the average degree of polymerization is 3 or more. In additional embodiments, polymers of this invention include those in which the average degree of polymerization is 6 or more or 10 or more. In other specific embodiments, polymers of this invention include those in which the average degree of polymerization is 20 or more. In other specific embodiments, polymers of this invention include those in which the average degree of polymerization is 50 or more.

The term "organic" refers to a chemical species, i.e., a molecule, moiety, radical, or functional or substituent group, which contains a single carbon atom (substituted with hydrogen or other substituent group, e.g., $CH_3$—, $CF_3$—, $CH_3$—NH—$CH_2$—) or contains covalently bonded carbon atoms and optionally contains various other atoms in addition to carbon and hydrogen. The bonds between carbons may be single, double, triple or aromatic (as in benzene). Carbons may be bonded in a linear chain, a branched chain, or a ring which may be an aromatic ring.

The term organic polymer refers to a polymer comprising organic polymer molecules in which at least one of the repeating units is an organic moiety which contains covalently bonded carbon atoms and optionally contains various other atoms. Typically an organic moiety contains a carbon-carbon bonded backbone or ring structure which may be substituted with various substituents (other than hydrogen) containing various atoms or in which the backbone remains predominantly composed of carbon, but may contain other atoms (e.g., O, S, N, etc.). Organic polymers may be formed having more than one repeat unit that are different in structure from each other, and are distributed along the polymer chain in any ordered or random arrangement or sequence. Therefore, the term polymer herein encompasses also random, alternated and block copolymers.

A monovalent organic radical (or simply a monovalent radical) is a group of atoms (molecular fragment) derived formally by removal of a single hydrogen atom from an organic molecule. Examples of monovalent organic radicals include, among others, $CH_3$— (methyl radical), $CH_3$—$CH_2$—, $HO$—$CH_2$—$CH_2$—, $C_6H_5$—$CH_2$—, and $CH_3$—$CH$=$CH$—. Additional organic radicals are species derived formally by removal of a single hydrogen atom from a non-carbon atom (e.g., O, N, S) in the organic molecule, such as alkoxide radicals (R—O—, where R is an alkyl or other organic group) which is derived by removal of hydrogen from an alcohol or an amine radical (RR'—N—, where one of R or R' is an alkyl or other organic group).

A divalent organic radical (or simply a divalent radical) is a group of atoms (molecular fragment) derived formally by removal of two hydrogen atoms from an organic molecule where both hydrogens may be removed from the same atom in the organic molecule or two different atoms in the organic molecule. Exemplary divalent organic radicals are: —$CR_2$—, —$CF_2$—, —$C_6R_4$— (a phenylene radical), —$(CR_2)_n$—, —$(CR_2)_n$—X—$(CR_2)_m$—, —X—$(CH_2)$—, —NR"—, where n and m are integers, each R, independent of other R's is hydrogen, halogen, alkyl or other organic group, R" is an organic group and X is O, S, NR, CO, CS, NRCO, COO, double bond, triple bond, or phenylene, among others.

A multivalent organic radical (or simply a multivalent radical) is a group of atoms (molecular fragment) derived formally by removal of three or more hydrogen atoms from an organic molecule. Examples of multivalent radicals include —(R)C<, —$(CR_2)_n$—CR<, —$(CR_2)_n$—X<, —$(CR_2)_n$—X(-)—$(CR_2)_m$—Y—, —$(CR_2)_n$—X(-)—$(CR_2)_m$—, where n and m are integers, each R, independent of other R's is hydrogen, halogen, alkyl or other organic group, X is N, CR, N—CO, and Y is $CR_2$, CO, COO, CS, O, S, NR, NR—CO, and phenyl ($C_6R_4$).

Organic radicals can contain linear or branched carbon chains or rings containing carbon and other atoms (e.g., O, S, N). Organic radicals can contain double bonded carbons, triple bonded carbons, non-aromatic or aromatic rings. Organic radical may be aliphatic, alicyclic or aromatic. An aliphatic organic radical results from removal of one or more hydrogen atoms from a saturated or unsaturated carbon compounds, in which the carbon atoms are joined in open chains. An alicyclic organic radical results from removal of one or more hydrogen atoms from a saturated or partially unsaturated cyclic compound carbon compound, An aromatic radical results from removal of one or more hydrogen atoms from an aromatic organic molecule. Carbons in organic radicals can be substituted with one or more various non-hydrogen substituents, including halogens, amino group, alkoxide or hydroxide groups, alkyl thiols or thiols, oxygen or sulfur (to form CO or CS groups).

A functional group is a combination of atoms (or in the case of halides a single atom) that when attached to an organic radical has either a specific reactivity or imparts to the molecule a specific character, for example, by electron withdrawing or electron donating action. Hydrogen is not a functional group. Typical functional groups include halogen atoms, nitro groups, cyano groups, cyanate groups, thiocyanate groups, isocyanate groups, thioisocyanate groups, alcohol groups (e.g. organic groups with one or more OH groups), polyol groups (e.g., organic groups with more than one and more typically a plurality of OH groups), alkoxide groups, ether groups (e.g., alkyl or other organic groups containing one or more C—O—C linkages), thiols, thioether groups (e.g., alkyl or other organic groups containing one or more C—S—C linkages), silyl (e.g., $R_3Si$—, where R is various substituents or organic groups), siloxy (e.g., $R_2$—Si(OR)—), aldehyde groups (organic radicals containing a —COH moiety), ketone groups (organic radicals containing a CO moiety), carboxylic acids (organic radicals containing —COOH groups or —COO$^-$ groups, carboxylic ester groups (organic groups containing —COOR" groups, where R" is an alkyl group or other organic group), acyl halide groups (organic groups containing —COX groups where X is a halide), anhydride groups (an organic group containing an anhydride group), groups containing other carboxylic acid derivatives, amino groups, alkyl amino groups, amino oxide groups and groups containing other derivatives of amino groups, diazo groups, azide groups, phosphoric acid ester groups, alkyl phosphate groups and groups containing other phosphoric acid derivatives, phosphinic acid groups, and groups containing phosphinic acid derivatives, phosphine groups, groups containing phosphonium salts, sulfuric acid ester groups, sulfate groups, sulfonate groups, groups containing sulfinic acid derivatives, groups containing sulfonium salts, groups containing oxonium salts, groups containing carbon-carbon double bonds (e.g., alkenyl groups) and groups containing carbon-carbon triple bonds (e.g., alkynyl groups), and combinations thereof. Functional groups include organic functional groups.

Many other functional groups are known in the art. Aldehyde groups, halogen atoms, isocyanate groups and acyl halide groups are examples, among many others, of functional groups that may be used to impart a desired reactivity to a molecule or polymer. Nitro groups, cyano groups, chlorine and bromine atoms, and carboxylic acid derivatives are examples, among many others, of functional groups with electron-withdrawing properties. Alcohol groups, alkoxide groups, thiol groups, mercapto groups, and amino groups are examples, among many others, of groups with electro-donating properties. The terms "electron-withdrawing group: and "electron-donating group" are terms that are well known in the art of chemistry. Many groups are known in the art which are classified into one of these groupings. These terms are used herein to have their broadest meaning in the art. One of ordinary skill in the art understands the meaning of these terms and knows how to select functional groups which will function as an electron-withdrawing group or an electron-donating group in a particular molecular structure.

A conjugated compound, fragment, moiety or group is a chemical species that contains one or more bonding orbitals that are not restricted to two atoms, but they are spread (or delocalized) over three or more atoms. A pi-conjugated (or π-conjugated) compound is a compound in which the delocalized molecular orbitals are made by overlap of atomic p orbitals such as the remaining (non hybridized) p orbital of an $sp^2$ hybridized carbon atom (M. B. Smith and J March, "March's Advanced organic Chemistry, Delocalized Chemical Bonding" $5^{th}$ Ed. John Wiley and Sons, 2001, p 32-33). This continuum of pi bonds defines pi-conjugation, often referred to simply as conjugation, and is most commonly observed in unsaturated or aromatic organic molecules.

Chemical species other than molecules, including radicals, moieties and groups may be conjugated.

Organic molecules include saturated, unsaturated and aromatic organic molecules. Chemical species other than molecules, including radicals, moieties and groups may be saturated, unsaturated or aromatic or contain portions that are saturated, unsaturated or aromatic. In a saturated organic molecule, each carbon has four bonds to other carbons, hydrogens, non-hydrogen substituents, or functional groups (that do not contain double or triple bonds). Exemplary saturated organic groups are alkyl groups which may be straight-chain, branched or cyclic alkyl groups, and which are optionally substituted with one or more non-hydrogen substituents, such as halogens, hydroxide groups, alkoxide groups, thiol groups, thioalkyl groups, ether groups, thioether groups, silyl groups (e.g., $R_3Si$— groups) and/or amino groups, among others.

Unsaturated organic molecules are molecules containing at least one carbon-carbon or carbon-heteroatom double bond (e.g., C=O, C=S, C=N). Exemplary unsaturated organic groups are alkenyl groups and alkynyl groups which may be straight-chain, branched or contain one or more ring groups, and which are optionally substituted with one or more non-hydrogen substituents, such as halogen atoms, or unsaturated functional groups (e.g., as listed above) and alkyl groups which are substituted with unsaturated functional groups, such as aldehyde and/or ketone groups (containing —COH or —CO—), carboxylic acid, carboxylate or carboxylic ester groups (containing —CO—O—), acyl halide groups, cyanide groups, isocyanide groups, among many others. Chemical species other than molecules, including radicals, moieties and groups may be unsaturated.

Aromatic organic molecules are defined in M. B. Smith and J March, "March's Advanced organic Chemistry, Delocalized Chemical Bonding" 5$^{th}$ Ed. John Wiley and Sons, 2001, p 46-48). Aromatic molecules may carry additional substituents including, halogens, organic functional groups, and organic radicals (substituents may be saturated and/or unsaturated groups). Chemical species other than molecules, including radicals, moieties and groups may be aromatic or contain portions that are aromatic. Aromatic organic radicals are molecular fragments formally obtained by removal of a hydrogen atom from the aromatic portion of an aromatic molecule.

A pi-conjugated polymer is an organic polymer comprising pi-conjugated repeat units in which one or more bonding orbitals are delocalized over at least two repeat units. A pi-conjugated organoboron polymer is a polymer whose backbone is made of repeat units that comprise both unsaturated and/or aromatic units and substituted or unsubstituted boron atoms, wherein the vacant p-orbital of the boron atoms conjugate with the pi-conjugated orbital system of the aromatic and/or unsaturated units. In a preferred embodiment the boron atoms are trivalent (i.e. carry three substituents) and are sp$^2$ hybridized. Repeating units of these polymers optionally contain one or more hydrogen substituents, including halogens or organic functional groups. In preferred organoboron polymers of this invention, the B atoms are substituted with a group that protects the B from attack and facilitates polymer stability.

A polymer end group is a functional group or an organic radical that terminates the polymer chains. Each linear polymer chain has two polymer end groups. Branched polymer chains have more than two end groups and cyclic polymer chains have no end groups. The remainder of a polymer chain is the entire polymer chain (backbone, optional functional groups, substituents and side chains) with the exclusion of the polymer end groups. Scheme 1 on the left shows representative polymer chain structures wherein X, Y, Z are repeat units that may be different or the same and may optionally be substituted with functional groups or organic radicals; A, B and C are the polymer end groups, and n, m, and l are integer numbers. Scheme 1 on the right shows the corresponding remainder of the polymer chains without the end groups.

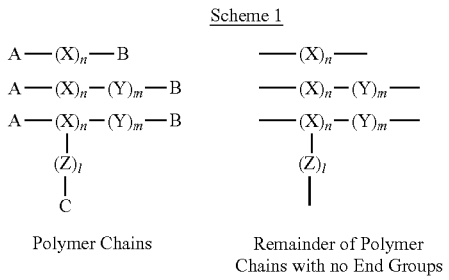

Scheme 1

Polymer Chains     Remainder of Polymer Chains with no End Groups

A reactive polymer end group is an end group that can either undergo further addition of monomer units, react with other polymer end groups, or react with the solvent or the environment under conditions where the remainder of the polymer chain is stable and non-reacting.

A non-reactive polymer end-group is an end group that cannot further add monomer units under the polymerization conditions used, cannot react with other polymer end groups, and is stable under the same conditions under which the remainder of the polymer chain is stable. A non-reactive polymer end-group may, however, be reactive under conditions that alter the composition of the remainder of the polymer chain.

An end-capped polymer is a polymer whose chains are terminated with an end-capper compound that is chemically different from the monomer or monomers used to make the polymer, and cannot further add monomer units under the polymerization conditions used. An end-capped pi-conjugated organoboron polymer is a pi-conjugated organoboron polymer whose polymer chains are terminated with an end-capper compound that is chemically different from the monomer or monomers used to make the polymer and cannot further add monomer units under the used polymerization conditions.

An end-capper compound is a reactive organic molecule used to terminate a polymerization reaction by capping the growing polymer chains. After reaction with the growing polymer chains the end-capper compound becomes a polymer end-group and cannot further add monomers to the polymer ends under the polymerization conditions used.

The classification of a specific end group as "reactive or "non-reacting" depends upon the polymerization conditions and purification method used as well as the structure of the polymer to which the end group is attached and those skilled in the art in view of the methods used know how to select groups which are non-reactive. It will also be understood in the art that some very low level of reactivity of a selected end group may occur that does not substantially detrimentally affect the use of the end group as a non-reactive end group. Thus, for example, hydrogen is a reactive end group if it is attached to a boron atom and we are carrying out a hydroboration polymerization (as in Example 9 herein), while it is a non-reactive end group if attached to an aromatic radical and we are carrying out a polymerization by Grignard coupling (as in Example 8 herein). Hydrogen, hydroxyl, methoxide, alkoxide, bromine, chlorine, halogens, metals, metal halides, oragnometallics, amines, substituted amines, thiols, acids, and carbon-carbon multiple bonds may be reactive end groups under selected polymerization conditions described herein.

A semiconductor is a material in which the uppermost band of occupied electron energy states is completely full at the temperature of 0 K (and without excitations). It is well-known from solid-state physics that electrical conduction in solids occurs only via electrons in partially-filled bands, so conduction in pure semiconductors occurs only when electrons have been excited-thermally, optically, or by other known means, into higher unfilled bands. At room temperature, a proportion (generally very small, but not negligible) of electrons in a semiconductor have been thermally excited from the "valence band," to the "conduction band." Semiconductors generally have bandgaps of approximately a few electron-volts, while insulators have bandgaps several times greater.

An n-type semiconductor is a semiconductor in which the conduction electron density exceeds the hole density and in which the electrical conduction is mainly due to the movement of these excess electrons.

A thin-film is defined as a continuous stratum of any material that is between 1 angstrom and 10,000 angstroms thick, and more preferably 100 to 10,000 angstroms thick. Thin-films include those ranging from 100 to 1,000 angstroms and those ranging from 100 to 5,000 angstroms.

A thin-film, organic electronic device is defined as a device comprising an active layer made of at least one thin-film comprising a semiconducting or conducting organic molecule or organic polymer in contact with two or more conducting materials acting as electrodes to which a current or voltage is applied or from which a current or voltage is obtained. Examples of thin-film organic electronic devices include, but are not limited to OPVs, organic diodes, organic photodiodes, organic TFTs, OFETs, printable or flexible electronics like RFID tags, electronic papers, printed circuit elements, OLEDs, PLEDs, thin-film capacitors and other energy storage devices. When the device is turned on the active layer exchanges charge carriers with one or more of the electrodes.

A thin-film, organic polymer, electronic device is defined as a device comprising an active layer made of at least one thin-film comprising a semiconducting or conducting organic polymer in contact with two or more conducting materials acting as electrodes to which a current or voltage is applied or from which a current or voltage is obtained. The terms conducting, conduction, and conductivity all refer to electronic or electrical conductivity and are not intended to refer to or imply ionic or thermal conductivity. As known by those of ordinary skill in the art, the active layer of a thin-film, organic polymer, electronic device may contain more than one stratum, typically a plurality of strata, of thin films of other materials or blends of materials, including but not limited to organic or inorganic molecules and polymers that have semi-conducting, conducting or non-conducting properties. These additional strata may play different roles in the device including, but not limited to: hole transporting layers (HTL), hole injecting layers (HIL), electron transporting layers (ETL), electron injecting layers (EIL), singlet light-emitting layers, triplet light-emitting layers, electron blocking layers, hole blocking layers, flattening layers, photon absorbing layers, barrier layers, charge separating layers, and dielectric layers.

An active layer of an electronic device is a layer comprising one or more thin films of semiconducting, conducting, or non-conducting materials and blends thereof. An active layer has a function in the electronic device other than providing mechanical strength to the device or acting as a substrate to carry an active layer. For example, the active layer may have one or more of the following functions: hole transporting, hole injecting, electron transporting, electron injecting, singlet light emission, triplet light emission, electron blocking, hole blocking, surface flattening function, photon absorption, barrier function, charge separation, and dielectric function.

In one embodiment of this invention the active layer comprises a single thin-film of a pi-conjugated organoboron polymer. In another embodiment, the active layer comprises a single thin-film made of a blend or mixture of materials, at least one of which is a pi-conjugated organoboron polymer. In yet another embodiment of this invention the active layer of the device comprises two or more thin films of semiconducting materials, at least one of which is a pi-conjugated organoboron polymer or a blend containing a pi conjugated organoboron polymer. When two or more thin-films are present in the active layer, these thin-films are in contact with any adjacent thin-films and electrodes.

In another embodiment of this invention the active layer comprises a single thin-film of an end-capped pi-conjugated organoboron polymer. In another embodiment, the active layer comprises a single thin-film made of a blend or mixture of materials, at least one of which is an end-capped pi-conjugated organoboron polymer. In yet another embodiment of this invention the active layer of the device comprises two or more thin films of semiconducting materials, at least one of which is an end-capped pi-conjugated organoboron polymer or a blend containing an end-capped pi conjugated organoboron polymer. When two or more thin-films are present in the active layer, these thin-films are in contact with any adjacent thin-films and electrodes.

In another embodiment of this invention the active layer comprises a single thin-film of a derivatized pi-conjugated organoboron polymer carrying a solubilizing group on the pendant organic group that is bonded to one or more than one boron atoms in the polymer backbone. In specific embodiments, the solubilizing group is bonded on each boron in the polymer. In other embodiments, the solubilizing group is bonded on 50% or more of the boron atoms in the polymer. In other specific embodiments, the solubilizing group is bonded to 10% or more or 25% or more of the boron atoms in the polymer. In another embodiment, the active layer comprises a single thin-film made of a blend or mixture of materials, at least one of which is the derivatized pi-conjugated organoboron polymer. In yet another embodiment of this invention the active layer of the device comprises two or more thin films of semiconducting materials, at least one of which is the derivatized pi-conjugated organoboron polymer or a blend containing the derivatized pi conjugated organoboron polymer. When two or more thin-films are present in the active layer, these thin-films are in contact with any adjacent thin-films and electrodes.

The devices of this invention include those which exhibit current rectification or diode-like properties. Current rectification is the conversion of alternating current into direct current. A diode is a device that preferably allows current to flow in one direction and not in the other. The devices of this invention include those wherein the thin film comprising a pi-conjugated organoboron polymer which emits light under a voltage bias.

The invention also provides devices wherein the active layer of the device contains, in addition to the thin film of the pi-conjugated organoboron polymer, a light-emitting thin film which comprises a light-emitting polymer which is not a pi-conjugated organoboron polymer, a light-emitting non-polymeric molecule, or an inorganic light emitting compound.

The invention further provides devices having an active layer which comprises at least one thin film that in turn comprises one or more pi-conjugated organoboron polymers blended with one or more light-emitting molecules, or polymers or an inorganic compound. The invention provides devices having an active layer comprising at least one thin film of a pi-conjugated organoboron polymer blended with a different organic or inorganic conducting or semiconducting material. This organic or inorganic conducting or semiconducting material may be one or more polymers, one or more non-polymeric molecules, one or more inorganic compounds, or a mixture thereof. More particularly, the active layer of the devices herein can comprise at least one thin film containing a p-type conducting or semiconducting polymer that is not a pi-conjugated organoboron polymer blended with a pi-conjugated organoboron polymer. In other embodiments, the active layer of the devices herein comprises at least one thin film containing inorganic p-type semiconducting particles mixed with a pi-conjugated organoboron polymer. More specifically, inorganic p-type semiconducting particles having at least one dimension less than 1000 angstroms can be employed in active layers herein. Regioregular poly(n-alkyl thiophene)s are examples of organic p-type semiconducting materials and boron-doped silicon, p-type gallium arsenide and p-type zinc telluride are examples of inorganic p-type semiconductors that can be used in this invention.

Devices of this invention further include those wherein the active layer further comprises an additional thin film of a dielectric material that is in contact with one or more additional electrodes. The layer of dielectric insulating material is usually in contact with one of the electrodes as exemplified in FIGS. 2E and 2F.

This invention relates to the use of pi-conjugated polymer in thin-film organic polymer electronic devices. These polymers all contain boron atoms in the pi-conjugated backbone of the polymer and preferably exhibit one or more of the following properties: n-type semiconducting properties, photoluminescence, and electroluminescence.

Pi-conjugated organoboron polymers of this invention are made of repeat units that comprise at least one boron atom and at least an aromatic or unsaturated fragment, such that conjugation of bonding orbitals extends over more than one repeat unit of the polymer and across the vacant p-orbital of the boron.

The preferred pi-conjugated organoboron polymers have a conjugated backbone comprised of unsaturated organic portions (or fragments) or aromatic organic portions (or fragments), or a mixture thereof and boron atoms which may be additionally substituted with a hydrogen, deuterium, halogen atoms, an organic functional group or an organic radical. Exemplary pi-conjugated organoboron polymers, represented by repeating units in brackets, are illustrated in Scheme 2A, where each R, independent of other R's in the repeating unit, and $R_1$, independent of any R's, can be hydrogen, deuterium, a halogen atom, or an organic radical, Ar represents a divalent aromatic radical which may optionally carry one or more other organic radical groups, substituent groups, and/or functional groups described herein and "n", "m" and "p" are integers indicating either the number of moieties present in a given repeating unit or the average degree of polymerization of the polymer dependent upon the structure illustrated. In Scheme 2A, $R_1$ is a substituent on the boron atom.

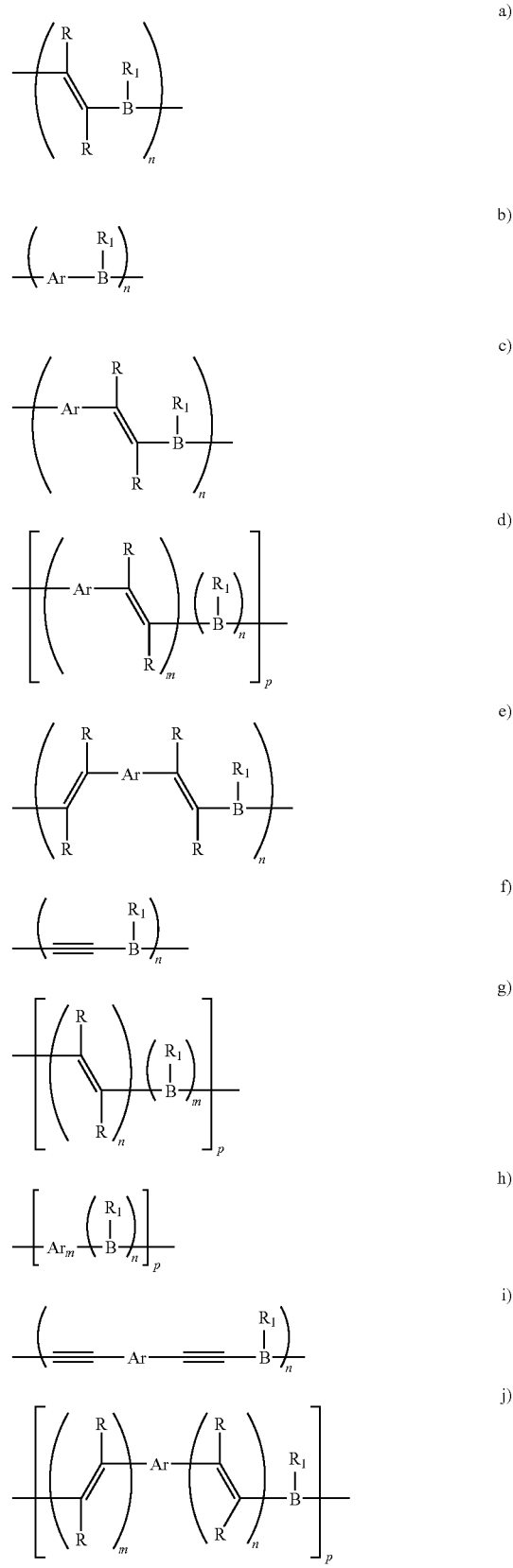

Scheme 2A

Scheme 2B

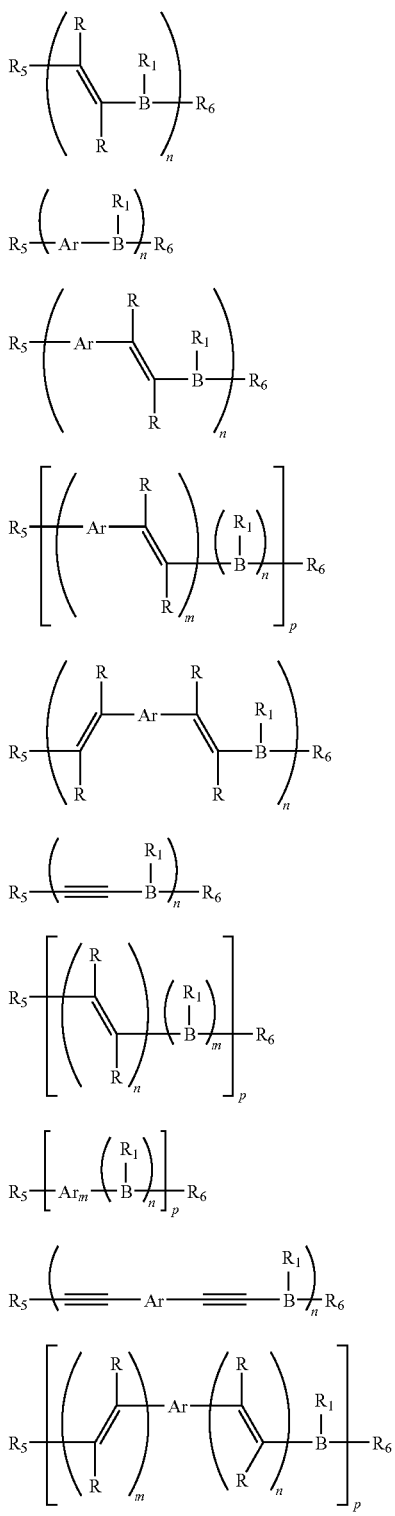

It has been found that end-capping of pi-conjugated organoboron polymers provides polymers with improved solubility and handling properties which improve the usefulness of the polymers in the preparation of thin films. Exemplary end-capped pi-conjugated organoboron polymers, represented by repeating units in brackets, are illustrated in Scheme 2B where variable are as defined above for Scheme 2A and $R_5$ and $R_6$ may be the same of different and are non-reactive polymer end groups as defined herein. In a preferred embodiment, $R_5$ and $R_6$ are the same.

The preferred unsaturated portions of the pi-conjugated organoboron polymers are vinylene, ethynylene, 1,3-butadienylene, and other divalent radicals comprising more than one conjugated carbon-carbon double bond, carbon carbon-triple bond, carbon-heteroatom double bond, carbon heteroatom triple bond, and mixtures thereof. More preferred are vinylene, ethynylene, and 1,3-butadienylene. Most preferred is vinylene. Additional unsaturated fragments may be oligomeric species comprising one or more of the repeat units listed above. The unsaturated fragment may optionally carry one or more substituent group including hydrogen, deuterium, halogens, any organic functional groups, or any monovalent, divalent or multivalent organic radicals.

The preferred aromatic portions (or fragments, —Ar—) of the pi-conjugated organoboron polymers in Schemes 2A, 2B and other schemes herein are divalent radicals resulting from the removal of two hydrogen atoms from benzene (such as 1,4 phenylene, 1,3-phenylene, and 1,2-phenylene), naphthalene, anthracene, tetracene, pentacene, pyrene, perylene, phenanthrene, coronene, diphenyl, pyridine, pyrimidine, triazine, pyrrole, N-alkylpyrroles, N-substituted pyrroles, 3-substituted pyrroles, furan, tetrazole, selenophene, tellurophene, indole, isoindole, isothianaphthalene, purine, oxadiazole, quinoxaline, quinoline, isoquinoline, benzimidazole, thiazole, triazole, phenazine, N,N'-dialkylphenazines, phenothiazine, N-alkylphenothiazines, dithienobenzene, thianaphthene, benzothiophene, isobenzothiophene, benzofurans, isobenzofuran, isoindoline, isobenzoselenophene, isobenzotellurophene, carbazole, N-alkylcarbazoles, thiophene, 3-alkylthiophenes, 3-substituted thiophenes, 3,4-disubstituted thiophenes, thienothiophene, substituted thienothiophenes, bithiophene, terthiophene, quaterthiophene, dialkyloxybenzenes, fluorene, 9,9-dialkylfluorenes and their substituted derivatives. These aromatic fragments are optionally substituted with one or more non-hydrogen substituents and/or functional groups as described herein. More preferred fragments are divalent radical fragments resulting from the removal of two hydrogen atoms from benzene, thiophene, 3-alkylthiophenes, bithiophene, terthiophene, quaterthiophene, dialkyloxybenzene, fluorene, 9,9-dialkylfluorenes and derivatives thereof. Additionally, the aromatic fragments may be oligomeric species comprising one or more of the repeating unit listed above and combinations of such repeating units. Ar can, for example, be an a divalent radical of an oligomeric group $(A)_q$ where each A, independently of any other A, is selected from any optionally substituted aromatic radical and more specifically any of the optionally substituted divalent aromatic radicals listed above and q is an integer ranging from 2 to 10, including 2-5 and 5-10 and any subranges thereof. In specific embodiments, All A may be the same or the oligomer may contain two or three different A groups which may be present in an ordered or random structure.

In specific embodiments of the compounds of Schemes 2A and 2B, each R, independent of any other $R_1$ is selected from an optionally substituted alkyl group having 1-6 carbon atoms, an optionally substituted aromatic group having 1 to 3 5- or 6-member rings. In specific embodiments, R is selected from hydrogen, deuterium, halogen, unsubstituted alkyl, halogenated alkyl, perfluoroalkyl, phenyl, halogenated phenyl, alkyl substituted phenyl, halogenated alkyl substituted phenyl, or optionally substituted biphenyl.

Additionally a combination of one or more unsaturated fragments and one or more aromatic fragments can be used (Schemes 2A-B, formulas c, d, e, and j). The aromatic fragment may optionally carry one or more substituents including hydrogen, deuterium, halogens, any organic functional groups, or any monovalent, divalent or multivalent organic radicals.

It is preferred that the $R_1$ group (referring to both Schemes 2A and 2B) on the boron atom is a bulky group that provides steric hindrance to the boron atoms and protects them from the attack by nucleophiles and radicals, such as water and oxygen. Steric hindrance occurs when functional groups on a molecule (or molecules individually) that would normally react with each other or be attracted to one another cannot interact due to their special relationship because the bulkiness of a side chains physically covers the reactive site or because, due to the shape or stiffness of a molecule, the reactive groups cannot come into contact. In another preferred embodiment, the $R_1$ groups is a solubilizing group, which can for example comprises a long chain alkyl or ether group to improve the solubility of the polymer in common organic solvents, and particularly those solvents listed in paragraph herein below The preferred organic groups "$R_1$" on the boron atoms are any aliphatic, alicyclic, or aromatic radicals including, but not limited to, methyl, trifluoromethyl, ethyl, n-propyl, iso-propyl, n-butyl, sec-butyl, t-butyl, thexyl, cyclohexyl, perfluorinated alkyls, phenyl, perfluorophenyl, alkyl-substituted phenyl, linear and branched alkyl groups, which optionally may carry additional functional groups such as carbon-carbon double or triple bonds, ester groups, cyano groups, nitro groups, halogens, alcohols, amines, ethers, aryl groups, which optionally may carry additional substituents such as alkyl groups and or functional groups such as carbon-carbon double or triple bonds, ester groups, cyano groups, nitro groups, halogens, alcohols, amines, ethers, and any other known organic functional group or organic radical. More preferred sterically bulky, organic groups are pentafluorophenyl, di(trifluoromethyl)phenyl, thexyl, 2-ethylhexyl, 1,3,5-trimethylphenyl(mesityl), and 1,3,5-triisopropylphenyl (tripyl) groups.

Other more preferred $R_1$ groups have formula X:

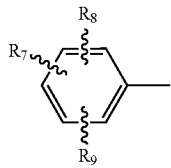

where $R_7$ is an organic radical with at least 4 carbon atoms, and more preferably at least 6 carbon atoms, which may optionally comprise one or more heteroatoms such as oxygen, sulfur or nitrogen and may optionally be substituted by one or more functional groups. $R_7$ may also comprise an oligomeric or a polymeric fragment which optionally may be substituted or terminated by another organic radical or functional group. $R_8$ and $R_9$ are either hydrogen, deuterium, fluorine, halogen, a functional group or an organic radical. Preferred $R_8$ and $R_9$ have less than 3 carbon atoms. $R_7$, $R_8$ and $R_9$ can also represent multiple independent substituents and/or functional groups on the rings shown. Additionally $R_7$, $R_8$ and $R_9$ can represent groups that link two ring positions, such as alkylene, ether or thioether linkages between two ring positions. The wavy line to the $R_7$, $R_8$ and $R_9$ groups indicates, as is understood in the art, that these groups may be attached at any ring positions in place of hydrogens. In formula X, as is conventional in the art, hydrogen substituents are not shown. Further any one or more hydrogen substituents on the aromatic rings in formula X can optionally be substituted with a non-hydrogen substituent, an organic radical or a functional group as described herein. In particular, any hydrogen substituent in the formulas can be replaced with a halogen, e.g., a fluorine atom, or an alkyl group having 1 to 12 carbon atoms. In a more preferred embodiment, $R_8$ and $R_9$ are in position 2 and 6 to the radical, and are selected from the group of hydrogen, methyl, trifluoromethyl and iso-propyl, and $R_7$ is in position 4 to the radical and is selected from the group of butyl, iso-butyl, hexyl, octyl, 2-ethylhexyl, decyl, dodecyl, butyloxy, hexyloxy, octyloxy, 2,ethylhexyloxy, decyloxy, 3,7-dimethyloctyloxy, dodeciloxy, or comprises an oligomer or a polymer of ethylene glycol or propylene glycol, which may optionally be terminated or substituted by an alkyl radical.

Selected structures of preferred pi-conducting organoboron polymers are shown in Scheme 3, wherein $R_1$, independent of other $R_1$ in the repeating unit and $R_2$, and $R_2$, and $R_3$, independent of any $R_1$, are hydrogens, deuterium atoms, halogen atoms, or linear or branched alkyl radicals, particularly alkyl radicals having 1-20 carbon atoms, which can be optionally substituted with one or more non-hydrogen substituents or functional groups as defined herein; $R_3$ is hydrogen, deuterium atom, halogen atom, or an alkoxide or mercapto group, particularly wherein the group has 1-20 carbon atoms, and which can optionally carry one or more additional non-hydrogen substituents or functional groups as defined herein; $R_4$ is an aliphatic radical (a saturated or unsaturated organic radical) particularly one which contains 1-20 carbon atoms, or an aromatic radical, such as a phenyl or substituted phenyl group, n is an integer number and m is a small integer number preferably 1 to 6, and most preferably 1 to 3. In the formulas B, C, F and G, $R_2$ and $R_3$ can also represent multiple independent substituent and/or functional groups on the rings shown. Additionally $R_2$ and $R_3$ can represent groups that link two ring positions, such as alkylene, ether or thioether linkages between two ring positions. The wavy line to the $R_2$ and $R_3$ groups indicates, as is understood in the art, that these groups may be attached at any ring positions in place of hydrogens. Note that in formulas shown herein, as is conventional in the art, hydrogen substituents are not shown. Further any one or more hydrogen substituents on the aromatic rings in the formulas of Scheme 3 can optionally be substituted with a non-hydrogen substituent or functional groups as described herein. In particular, any hydrogen substituent in the formulas can be replaced with a halogen, e.g., a fluorine atom, or an alkyl group having 1 to 3 carbon atoms.

Each of the polymers illustrated in Scheme 3 can be end capped with $R_5$ and $R_6$ groups as illustrated in Scheme 2B.

In specific embodiments, pi-conjugated organoboron polymers include those of formula A in Scheme 3 wherein $R_1$ is an alkyl group having 1 to 12 carbon atoms which is optionally substituted with one or more non-hydrogen substituents, particularly one or more halogens, such as fluorine, and $R_2$ is an alkyl group having 3 to 20 carbon atoms which is optionally substituted with one or more non-hydrogen substituents, particularly one or more halogens, such as fluorine. In specific embodiments, pi-conjugated organoboron polymers include those of formula A in Scheme 3 wherein $R_1$ is a straight-chain or branched alkyl group having 1 to 6 carbon atoms and $R_2$ is a straight-chain or branched alkyl group having 6 to 12 carbon atoms. In more specific embodiments, pi-conjugated organoboron polymers include those of formula A in Scheme 3 wherein $R_1$ is a methyl or propyl group, particularly an isopropyl group and $R_2$ is a straight-chain or branched alkyl group having 6 to 12 carbon atoms. In more specific embodiments, pi-conjugated organoboron polymers include those of formula A in Scheme 3 wherein $R_1$ is a straight-chain or branched alkyl group having 1-6 carbon atoms and $R_2$ is a straight-chain alkyl group having 6-16 carbon atoms, and more specifically a straight-chain alkyl group having 6 or 12 carbons atoms or $R_2$ is a branched alkyl group having 6 to 16 carbon atoms and more specifically a branched alkyl group having 8-12 carbon atoms.

Scheme 3

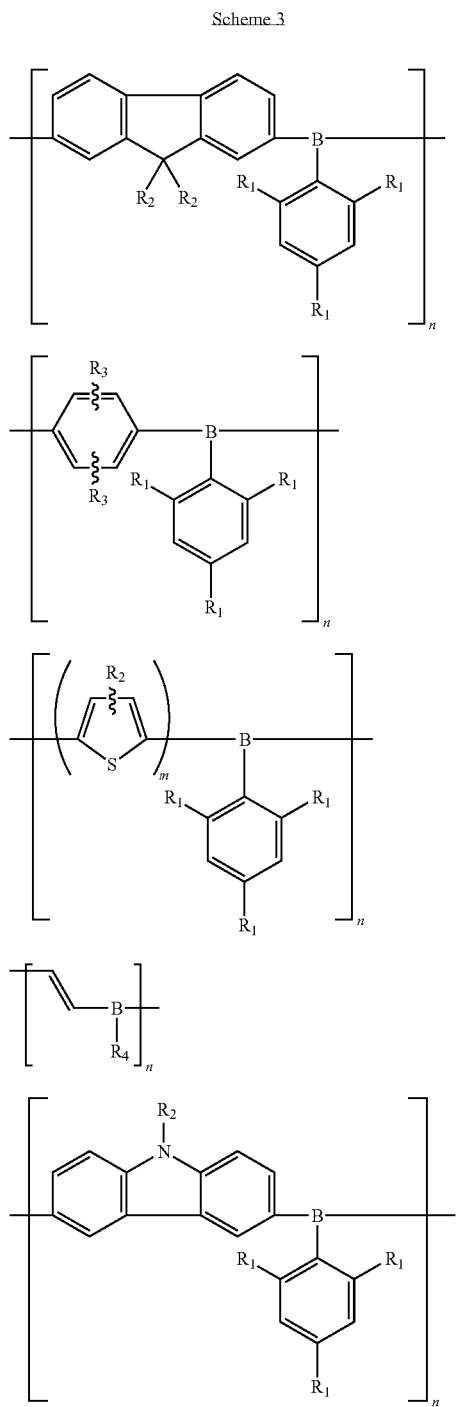

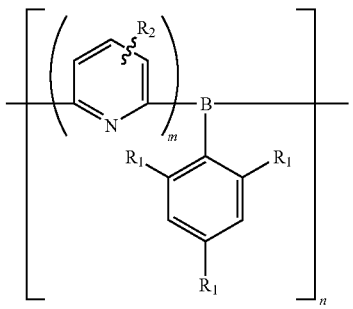

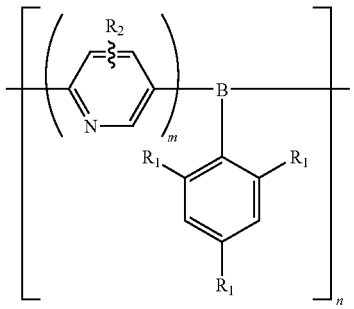

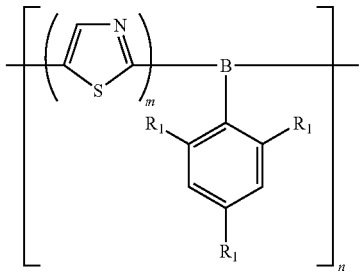

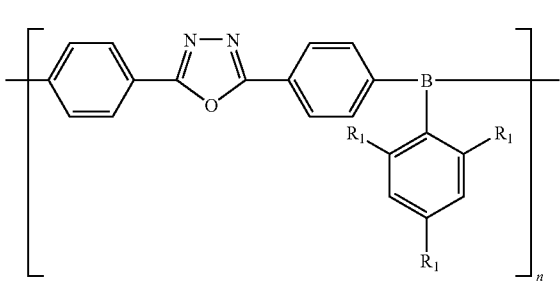

Preferred non-reactive end-group $R_5$ and $R_6$ in Scheme 2B are any mono-functional aliphatic, alicyclic or aromatic radicals or functional groups that are stable under the conditions used during polymerization, purification, storage and handling of the pi-conjugated organoboron polymers. To properly select $R_5$ and $R_6$, one must consider the conditions that are present during the polymerization, purification and storage of the polymers. Thus, the same end-group may be preferred when used with certain polymerization and purification methods and non-preferred when different polymerization and purification methods are used. Preferred non-reactive end-group $R_5$ and $R_6$ in Scheme 2B include methyl, trifluoromethyl, ethyl, n-propyl, iso-propyl, n-butyl, sec-butyl, t-butyl, n-pentyl, amyl, neopentyl, n-hexyl, t-hexyl, cyclohexyl, perfluorinated alkyls, phenyl, perfluorophenyl, alkyl-substituted phenyl, fluorophenyl, difluorophenyl, trifluorophenyl, tertrafluorophenyl, pentafluorophenyl, alkoxyphenyl, doalkoxyphenyl, dialkylaminophenyl, alkylthiophenyl, naphthyl, naphthalenyl, anthracenyl, tetracenyl, pentacenyl, alkylnaphthyl, alkylnaphthalenyl, alkylanthracenyl, alkyltetracenyl, alkylpentacenyl, other substituted naphthyl radicals, other substituted naphthalenyl radicals, other substituted anthracenyl radicals, other substituted tetracenyl radicals, other substituted pentacenyl radicals, trifluoromethylphenyl, di(trifluoromethyl)phenyl, 2-ethylhexyl, linear and branched alkyl groups, 1,3, 5-trimethylphenyl(mesityl), and 1,3,5-triisopropylphenyl (tripyl) groups, thienyl, N-alkylpyrrolyl, fluorenyl, pyridinyl, furanyl, furfuryl, thenyl, pyridyl, pyrazinyl, pyrimidyl, which optionally may carry additional non-reactive functional groups such as carbon-carbon double or triple bonds, ester groups, cyano groups, nitro groups, halogens, alcohols, amines, ethers, aryl groups, which optionally may carry additional substituents such as alkyl groups and or functional groups such as carbon-carbon double or triple bonds, ester groups, cyano groups, nitro groups, halogens, alcohols, amines, ethers, and any other known organic functional group or organic radical, diphenylborane, dytolylborane, bis(alpine)borane, bis(dialkylamino)borane, di(alkoxyphenyl)borane, di(clholorphenyl)borane, di(perfluorophenyl)borane, dicyclohexylborane, dicyclopentylborane, di(mesythylborane), di(trypil)borane, and 9-borabicyclo[3.3.1]nonane More preferred $R_5$ and $R_6$ end-groups are phenyl, tolyl, alkylphenyl, xylyl, 3,5-dimethylphenyl, 3,5-(diisopropyl)phenyl, pentafluorophenyl, di(trifluoromethyl)phenyl, thexyl, 2-ethylhexyl, 1,3,5-trimethylphenyl(mesityl), and 1,3,5-triisopropylphenyl(tripyl) groups, diphenylborane, and di(mesytylborane). Other more preferred $R_5$ and $R_6$ end-groups having formula X where $R_7$, $R_8$ and $R_9$ have been defined above.

Hydrogen, hydroxyl, methoxide, alkoxide, bromine, chlorine, halogens, metals, and carbon-carbon multiple bonds are not preferred $R_5$ and $R_6$ end groups.

Preferred end-capped organoboron polymers are shown in Scheme 4, structures A and B, where $R_1$, $R_5$ and $R_6$ have been defined above, $R_2$'s may be the same or different and are independently from each other selected from the group of hydrogen, deuterium, halogens, methyl, ethyl, trifluoromethyl, trimethylsilyl, an alkyl radical, or a perfluoroalkyl radical; m is a small integer number from 1 to 4 and n is an integer number from 2 to 10,000, and Ar is a divalent aromatic radical resulting from the removal of two hydrogen atoms from benzene (such as 1,4 phenylene, 1,3-phenylene, and 1,2-phenylene), dialkyl benzenes, dialkoxybenzene, naphthalene, anthracene, tetracene, pentacene, pyrene, perylene, phenanthrene, coronene, diphenyl, pyridine, pyrimidine, triazine, pyrrole, N-alkylpyrroles, N-substituted pyrroles, 3-substituted pyrroles, furan, tetrazole, selenophene, tellurophene, indole, isoindole, isothianaphthalene, purine, oxadiazole, quinoxaline, quinoline, isoquinoline, benzimidazole, thiazole, triazole, phenazine, N,N'-dialkylphenazines, phenothiazine, N-alkylphenothiazines, dithienobenzene, thianaphthene, benzothiophene, isobenzothiophene, benzofurans, isobenzofuran, isoindoline, isobenzoselenophene, isobenzotellurophene, carbazole, N-alkylcarbazoles, thiophene, 3-alkylthiophenes, 3-substituted thiophenes, 3,4-disubstituted thiophenes, thienothiophene, substituted thienothiophenes, bithiophene, terthiophene, quaterthiophene, or dialkyloxybenzenes, which may optionally be substituted with an organic radical or a functional group as defined herein.

Scheme 4

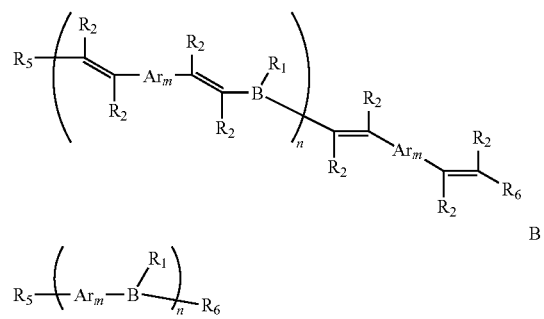

More preferred end-capped organoboron polymers are shown in Scheme 5 Structures C to G where $R_1$, $R_2$, $R_3$, and $R_4$ independently from each other are hydrogens, deuterium atoms, halogen atoms, or linear or branched alkyl radicals, aromatic radicals, alkoxy radicals, mercapto radicals or amino alkyl radicals. Preferred alkyl radicals have 1-30 carbon atoms, and can be optionally substituted with one or more non-hydrogen substituents or functional groups as defined herein. In the formulas C to G, $R_2$, $R_3$ and $R_4$ can also represent multiple independent substituents and/or functional groups on the rings shown. Additionally $R_2$, $R_3$ and $R_4$ can represent groups that link two ring positions, such as alkylene, ether or thioether linkages between two ring positions. The wavy line to the $R_2$, $R_3$ and $R_4$ groups indicates, as is understood in the art, that these groups may be attached at any ring positions in place of hydrogens. Note that in formulas shown herein, as is conventional in the art, hydrogen substituents are not shown. Further any one or more hydrogen substituent on the aromatic rings in Scheme 5 can optionally be substituted with a non-hydrogen substituent, an organic radical or a functional group as described herein. In particular, any hydrogen substituent in the formulas can be replaced with a halogen, e.g., a fluorine atom, or an alkyl group having 1 to 12 carbon atoms.

In specific embodiments of this invention preferred end-capped organoboron polymers have structures C to G in Scheme 5 where $R_1$ is selected from the group of phenyl, fluorophenyl, difluorophenyl, trifluorophenyl, pentafluorophenyl, methylphenyl, trifluoromethylphenyl, alkylphenyl, alkyldimethylphenyl, alkoxydimethylphenyl, alkyloxyphenyl, isopropylphenyl, hexylphenyl, hexyloxyphenyl, mesityl, tripyl, butylphenyl, iso-butylphenyl, octylphenyl, 2-ethylhexylphenyl, decylphenyl, dodecylphenyl, butyloxyphenyl, hexyloxyphenyl, octyloxyphenyl, 2'-ethylhexyloxyphenyl, decyloxyphenyl, 3',7'-dimethyloctyloxyphenyl, and dodecyloxyphenyl. $R_2$s may be the same or different and are selected independently from each other from the group of hydrogen, deuterium, fluorine, halogens, trifluoromethyl, methyl, ethyl, or iso-propyl, m is 1 or 2, and n is an integer number from 2 to 100, $R_3$ is hydrogen or a linear or branched alkoxy radical having 1 to 20 carbon atoms, and $R_4$ is hydrogen or a linear or branched alkyl radical with 1 to 20 carbon atoms.

Scheme 5
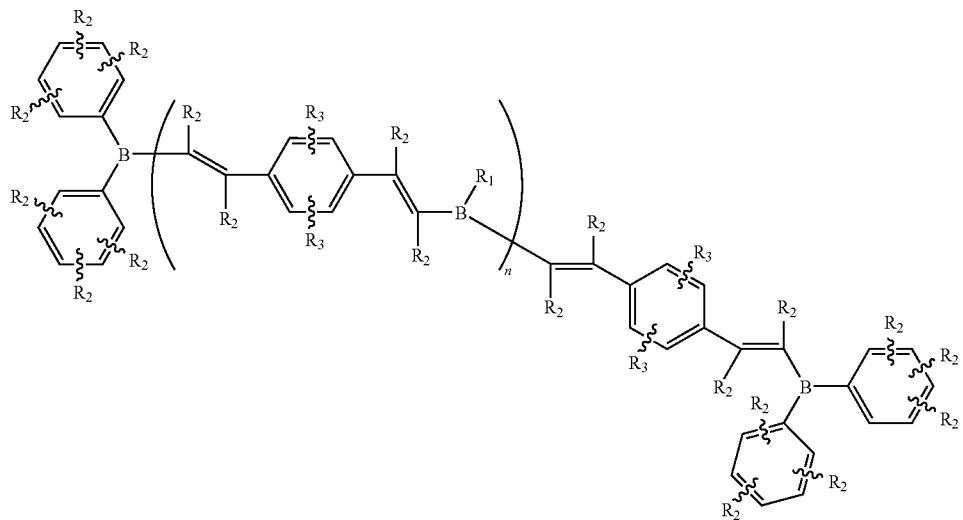
C
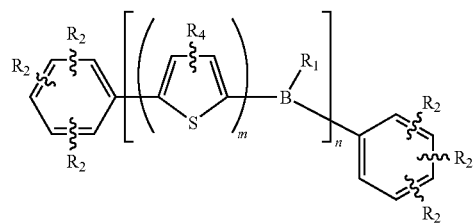
D
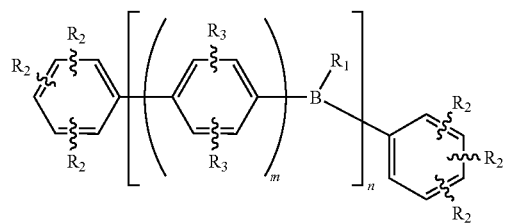
E
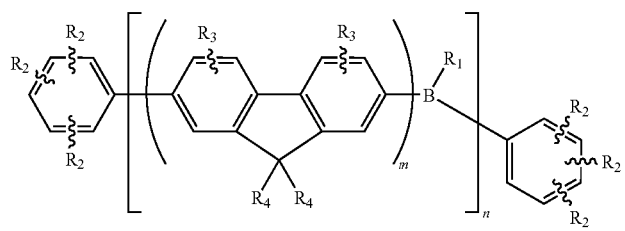
F
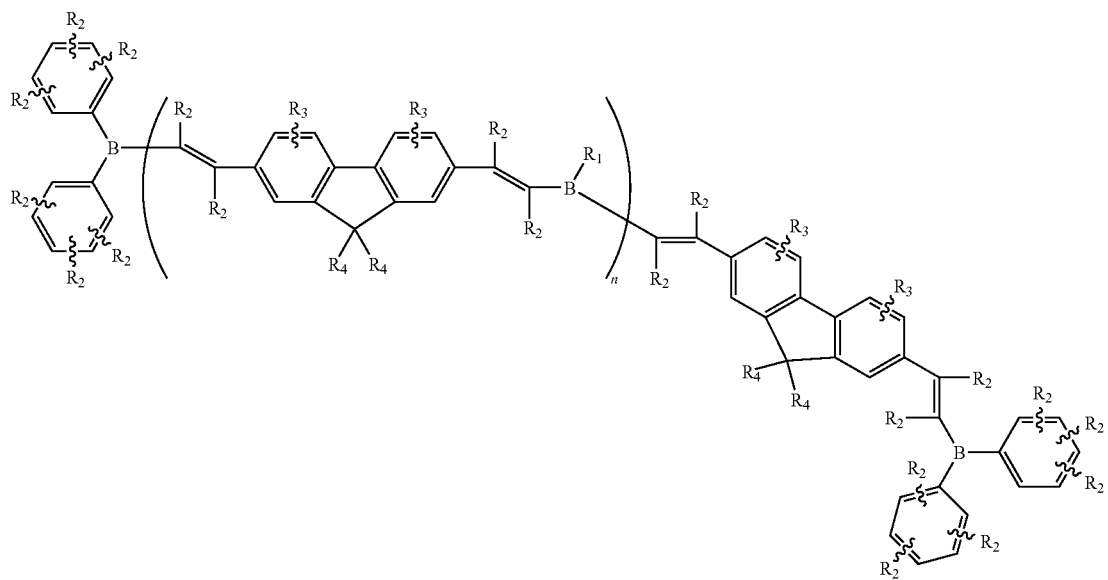
G

A preferred method of preparing pi-conjugated organoboron polymers is by reacting the respective dibrominated unsaturated or aromatic compounds with dimethoxymesitylborane or dimethoxytripylborane in the presence of magnesium via the formation of the Grignard reagent (as exemplified in Example 1). Yet another preferred method of preparing pi-conjugated organoboron polymers is by reacting dilithiated unsaturated or aromatic compounds with dimethoxymesitylborane, dimethoxytripyl-borane, dichlorophenylborane or dichloro-t-hexylborane (as exemplified in Example 3 and 4). Other organometallic coupling reagents may be used for this application in place of the Grignard reagent or lithium derivatives, including copper derivatives, tin derivatives, nickel derivatives, and silyl derivatives. These methods can be used to prepare, for example, compounds of the type of formula a, b f and i in Scheme 2A.

Compounds of the type g and h in Scheme 2A can be prepared by reacting the dibromo derivative of an oligomeric or telechelic species of the unsaturated or aromatic monomer with a borane reagent. Oligomerization of the aromatic or unsaturated compound and coupling with the borane reagent may occur in a single step if the proper organometallic intermediate and the proper reaction conditions are used. Preferred borane reagents are compounds containing a trivalent boron atom that is substituted with an alkyl or aryl group and two reactive groups such as alkoxy groups or halogen atoms. Dimethoxymesitylborane, dimethoxytripylborane, dichlorohexylborane and dichlorophenylborane are examples of borane reagents.

Another preferred method to prepare pi-conjugated organoboron polymers is by the hydroboration or dihydrobromination of dialkynes (Chujo et al. *J. Am. Chem. Soc.*, 120, 5112-5113, 1998; Chujo et al. *Polymer Bulletin*, 42, 505-510, 1999). This method can be used, for example, to prepare compounds of the type of formulas e, g and j in Scheme 1.

Compounds of the type of formulas c and d in Scheme 2A can be prepared by coupling of borane reagents with asymmetric organometallic compounds or via more complex synthesis comprising multiple steps or hydroboration and coupling.

A preferred method of preparing end-capped pi-conjugated organoboron polymers, such as those in Scheme 2B, is by reacting the difunctional organometallic derivative of an unsaturated or aromatic repeat unit with a difunctional borane reagent. The polymerization reaction is allowed to proceed until the desired average molecular weight is reached or until the polymerization reaction naturally stops and then an end-capper compound is added to the reaction mixture. The capping reaction is allowed to proceed for a desired amount of time and then the product is purified according to standard organic chemistry practice.

Preferred difunctional organometallic derivatives for use with this method include Grignard reagents (as exemplified in Example 8), lithium derivatives, copper derivatives, tin derivatives, zinc derivatives, nickel derivatives and silyl derivatives. Other preferred difunctional organometallic derivatives are shown in Scheme 6 where Ar is a divalent aromatic radical as defined herein, and M is Li, MgBr, MgI, MgCl, ZnCl, ZnBr, ZnI, CdCl, CdBr, CdI CdR, HgCl, HgBr, HgI, HgR, HgOR, CeCl$_2$, CeBr$_2$, CeI$_2$, CuR, CuRLi, CuCl, CuBr, CuI, Cu, PdR, AgCl, Ag, Br, AgI, Ag, AgR, NiCl, NiBr, NiI, NiR, SnR$_3$, or SiR$_3$. Preferred M is Li, MgBr, CuR, and SnR$_3$.

Scheme 6

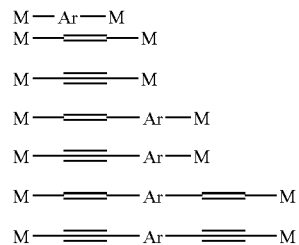

Difunctional borane reagents are compounds containing a trivalent boron atom that is substituted with an alkyl or aryl group and two reactive groups such as alkoxy groups or halogen atoms. Preferred difunctional borane reagents include dimethoxyalkylboranes, dimethoxyarylboranes, dichloroalkylboranes, dichloroarylboranes, dibromoalkylboranes, dibromoarylboranes, diiodoalkylboranes, and diiodoarylboranes. Dimethoxymesitylborane, dimethoxytripylborane, dichlorophenylborane, dichloro-t-hexylborane, and dichloropentafluorophenylborane are examples of preferred difunctional borane reagents.

Other preferred difunctional borane reagents have structure shown in Formula XX:

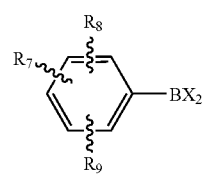

XX where X is selected from the group of methoxy, alkoxy, acetate, hydrogen, carboxylate, mercapto, fluoro, chloro, bromo, iodo, tosilate, triflate, or any other suitable leaving group, where R$_7$ is either hydrogen, deuterium, fluorine, halogen, a functional group or an organic radical. Preferred R$_7$ is an organic radical with at least 4 carbon atoms, and more preferably at least 6 carbon atoms, which may optionally comprise one or more heteroatoms such as oxygen, sulfur or nitrogen and may optionally be substituted by one or more functional groups. R$_7$ may also comprise an oligomeric or a polymeric fragment which optionally may be substituted or terminated by another organic radical or functional group. R$_8$ and R$_9$ are either hydrogen, deuterium, fluorine, halogen, a functional group or an organic radical. Preferred R$_8$ and R$_9$ have less than 3 carbon atoms. R$_7$, R$_8$ and R$_9$ can also represent multiple independent substituents and/or functional groups on the rings shown. Additionally R$_7$, R$_8$ and R$_9$ can represent groups that link two ring positions, such as alkylene, ether or thioether linkages between two ring positions. The wavy line to the R$_7$, R$_8$ and R$_9$ groups indicates, as is understood in the art, that these groups may be attached at any ring positions in place of hydrogens. Note that in Formula XX shown herein, as is conventional in the art, hydrogen substituents are not shown. Further any one or more hydrogen substituents on the aromatic rings in Formula XX can optionally be substituted with a non-hydrogen substituent, an organic radical or a functional group as described herein. In particular, any hydrogen substituent in the formulas can be replaced with a halogen, e.g., a fluorine atom, or an alkyl group having 1 to 12 carbon atoms. In a more preferred embodiment $R_8$ and $R_9$ are in position 2 and 6 to the radical, and are selected from the group of hydrogen, methyl, trifluoromethyl and iso-propyl, and $R_7$ is in position 4 to the radical and is selected from the group of butyl, iso-butyl, hexyl, octyl, 2-ethylhexyl, decyl, dodecyl, butyloxy, hexyloxy, octyloxy, 2,ethylhexyloxy, decyloxy, 3,7-dimethyloctyloxy, dodeciloxy, or comprises an oligomer or a polymer of ethylene glycol or propylene glycol, which may optionally be terminated or substituted by an alkyl radical.

The difunctional organometallic derivatives may be added to the borane reagent as such, or may be generated in situ from the corresponding dibromo- or diiodo compounds in the presence of the appropriate reducing metal (as shown in Example 8). This second approach is especially desirable when using a magnesium reagent (i.e. a Grignard regent) or a zinc reagent. The difunctional organometallic derivative may also be a transient species generated under a catalyst of an appropriate metal compound or complex.

Preferred end-capper compounds are monofunctional organometallic reagents having formula RM, where R is an organic radical and M was defined above. In a preferred embodiments R is an aromatic radical. In more preferred embodiment the end capper is phenyl lithium, phenylmagnesium bromide, tosyl lithium, tosylmagnesium bromide, 3,5-dimethyl phenyl lithium and 3,5-dimethyl phenylmagnesium bromide. The end capper may be added to the reaction mixture as such, or may be generated in situ from the corresponding monobromo- or monoiodo compound in the presence of the appropriate reducing metal. This second approach is especially desirable when using a magnesium reagent (i.e. a Grignard regent) or a zinc reagent (as shown in Example 8.).

As known in the art many variations to this procedure exist. These methods can be used to prepare, for example, compounds of the type of formula a, b, f and i in Scheme 2B, formula B in Scheme 4, and of formula D, E and F in Scheme 5.

Compounds of the type g and h in Scheme 2B can be prepared by reacting the dibromo derivative of an oligomeric or telechelic species of the unsaturated or aromatic monomer with a borane reagent followed by the capping reaction with a compound of the type RM, as defined herein. Oligomerization of the aromatic or unsaturated compound and coupling with the borane reagent may occur in a single step if the proper organometallic intermediate and the proper reaction conditions are used. Compounds of the type of formulas c and d in Scheme 2B can be prepared by coupling of borane reagents with asymmetric organometallic compounds and then capping the reaction with a monofunctional organometallic end-capper as described herein.

A preferred purification method comprises repeatedly dissolving the crude product in an appropriate solvent and forcing the polymer out of solution (fluoculating and or precipitating the polymer) with the addition of a different solvent of opposite polarity. Useful solvents may include methanol, ethanol, ethyl acetate, other esters, acetone, other ketones, dichloromethane, chloroform, diethyl ether, pentane, hexane, petroleum ether, cyclohexane, toluene, and xylene. Couples of solvents of opposite polarity include, for example, methanol and chloroform, or chloroform and petroleum ether. Another preferred purification is by continuous extraction in either a liquid or gas phase. A convenient method to carry out this type of extraction is by using a Soxhlet extractor, which is a piece of laboratory apparatus well known by those skilled in the art. Proffered solvents for the extraction are solvents that solubilize the unreacted reagents, byproducts and low molecular weight oligomers. Preferred solvents include methanol and acetonitrile.

Another preferred method to prepare end-capped pi-conjugated organoboron polymers is by the hydroboration or haloboration of dialkynes with difunctional hydroborating or haloborating reagents (Example 10). The polymerization reaction is allowed to proceed until the desired average molecular weight is reached or until the polymerization reaction naturally stops and then an end-capper compound is added to the reaction mixture. The capping reaction is allowed to proceed for a desired amount of time and then the product is purified according to standard organic chemistry practice. Preferred dialkynes to use in this process have formula in Scheme 7 where Ar is a divalent aromatic radical which may be optionally substituted with one or more organic radical or organic functional groups as defined herein, and R is hydrogen, deuterium, a halogen atom, an alkyl radical, an organic functional group or an organic radical. In preferred embodiments Ar is a radical resulting from removing two hydrogen atoms from benzene, alkoxybenzene, substituted benzene, dialkoxybenzene, fluororene, 9,9-dialkylfluororene, thiophene, or 3-alkylthiophene, biothiophene, terthiophene, and quaterthiophene, and R is hydrogen, methyl, trifluormethyl, or trimethylsilyl.

Scheme 7

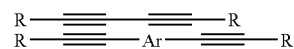

Preferred hydroboration or haloboration reagents are compounds of formula $RBH_2$ or $RBX_2$, where R is an organic radical and X is a halogen atom.

Preferred hydroboration reagents include mesitylborane, tripylborane, phenylborane, t-hexylborane, and pentafluorophenylborane. Other preferred hydroboration reagents have structure shown in Formula XX where X is hydrogen, and $R_7$, $R_8$ and $R_9$ are defined above.

End-capper compounds for the hydroboration polymerization are compounds of formula $R_2BH$ where R is an organic radical. Preferred end-capper compounds include among other, diphenylborane, dimesitylborane, dicyclohexylborane, dicyclopentylborane, and 9-borabicyclo[3.3.1]nonane (9-BBN). Purification of these polymers is similar to what described for the polymers made by coupling of difunctional organometallic derivatives.

This method can be used, for example, to prepare compounds of the type of formulas e, g and j in Scheme 2B formula A in Scheme 4 and formula C and G in Scheme 5.

Polymers of this invention, including those illustrated in Schemes 2A, 2B and, 3-5 can be readily prepared by one of ordinary skill in the art in view of the description herein and in view of methods that are well-known in the art. Those of ordinary skill in the art will appreciate that methods other than those specifically exemplified herein can be used to prepare the desired end-capped pi-conjugated organoboron polymers.

This invention also discloses novel pi-conjugated organoboron polymers that are not end-capped and bear solubilizing side chains on the boron protecting groups. The novel non-end-capped polymers of this invention have structures H and I in Scheme 8 where $R_2$s may be the same or different and are independently from each other selected from the group of hydrogen, deuterium, halogens, methyl, ethyl or an alkyl radical, perfluoroalkyl, and trimethylsilyl; m is a small integer number from 1 to 4 and n is an integer number from 2 to 10,000, and Ar is a divalent aromatic radical resulting from the removal of two hydrogen atoms from benzene (such as 1,4 phenylene, 1,3-phenylene, and 1,2-phenylene), dialkyl benzenes, dialkoxybenzene, naphthalene, anthracene, tetracene, pentacene, pyrene, perylene, phenanthrene, coronene, diphenyl, pyridine, pyrimidine, triazine, pyrrole, N-alkylpyrroles, N-substituted pyrroles, 3-substituted pyrroles, furan, tetrazole, selenophene, tellurophene, indole, isoindole, isothianaphthalene, purine, oxadiazole, quinoxaline, quinoline, isoquinoline, benzimidazole, thiazole, triazole, phenazine, N,N'-dialkylphenazines, phenothiazine, N-alkylphenothiazines, dithienobenzene, thianaphthene, benzothiophene, isobenzothiophene, benzofurans, isobenzofuran, isoindoline, isobenzoselenophene, isobenzotellurophene, carbazole, N-alkylcarbazoles, thiophene, 3-alkylthiophenes, 3-substituted thiophenes, 3,4-disubstituted thiophenes, thienothiophene, substituted thienothiophenes, bithiophene, terthiophene, quaterthiophene, dialkyloxybenzenes, and their substituted derivatives, and $R_1$ has formula X where $R_7$ is an organic radical with at least 6 carbon atoms, which may optionally comprise one or more heteroatoms such as oxygen, sulfur or nitrogen and may optionally be substituted by one or more functional groups. $R_7$ may also be comprise an oligomeric or a polymeric fragment which optionally may be substituted or terminated by another organic radical or functional group. $R_8$ and $R_9$ are either hydrogen, deuterium, fluorine, halogen, an methyl, ethyl, isopropyl, an alkyl radical, a functional group or an organic radical. Preferred $R_8$ and $R_9$ have less than 3 carbon atoms. $R_7$, $R_8$ and $R_9$ can also represent multiple independent substituents and/or functional groups on the rings shown. Additionally $R_7$, $R_8$ and $R_9$ can represent groups that link two ring positions, such as alkylene, ether or thioether linkages between two ring positions. The wavy line to the $R_7$, $R_8$ and $R_9$ groups indicates, as is understood in the art, that these groups may be attached at any ring positions in place of hydrogens. Note that, as is conventional in the art, hydrogen substituent are not shown. Further any one or more hydrogen substituents on the aromatic rings in formula X can optionally be substituted with a non-hydrogen substituent, an organic radical or a functional group as described herein. In particular, any hydrogen substituent in the formulas can be replaced with a halogen, e.g., a fluorine atom, or an alkyl group having 1 to 12 carbon atoms. In a more preferred embodiment $R_8$ and $R_9$ are in position 2 and 6 to the radical, and are selected from the group of hydrogen, methyl and iso-propyl, and $R_7$ is in position 4 to the radical and is selected from the group of hexyl, octyl, 2-ethylhexyl, decyl, dodecyl, butyloxy, hexyloxy, octyloxy, 2-ethylhexyloxy, decyloxy, 3,7-dimethyloctyloxy, dodecyloxy, or an oligomer or a polymer of ethylene glycol or propylene glycol which may optionally be terminated or substituted by an alkyl radical.

Scheme 8

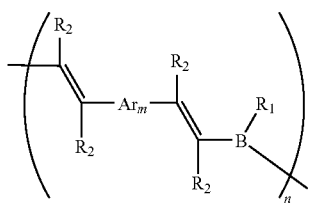

H

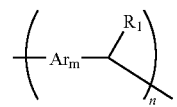

I

Preferred end-capped or non-end-capped pi-conjugated organoboron polymers comprise at least two repeating units and have weight average molecular weights ranging from 50 Dalton to one million Dalton as determined by Gel Permeation Chromatography (GPC). More preferred polymers have weight average molecular weights ranging from 500 to 100,000, and most preferably from 3,000 to 30,000.

In a preferred embodiment the end-capped pi-conjugated organoboron polymers of this invention are soluble as prepared and maintain their solubility after a minimum of four cycles of purification by dissolution of the polymer in one solvent and forcing the polymer out of solution using a selected solvents or with a Soxhlet extraction. For fabrication of devices, preferred solubility after purification is higher than 1 g/L and more preferably higher than 10 g/L. Certain organoboron polymers which were not end capped were found to be soluble as prepared, but to become progressively more insoluble after each purification cycle, to the point of insufficient solubility after four cycles of dissolution and crashing.

In another preferred embodiment the pi-conjugated organoboron polymers of this invention have high electron affinity, preferably higher than 3 eV, more preferably higher than 3.5 eV and most preferably higher than 4 eV (Examples 8 and 9.) The electron affinity of conjugated polymers and molecules can be estimated as the difference in energy between the lowest unoccupied molecular orbital (LUMO) and the energy of the vacuum. This quantity can be calculated as the difference between the energy of the highest occupied molecular orbital (HOMO) and the bandgap (HOMO-LUMO gap). The most direct way to measure these properties is through Ultraviolet Photoelectron Spectroscopy (UPS) combined with UV-visible absorbance spectroscopy (UV-vis). UPS gives a direct measure of the work function and the difference in energy between the highest occupied molecular orbital (HOMO) and the vacuum electron level. The work function is defined as the difference between the Fermi electron level and the vacuum electron level, can also be directly determined from the secondary electron cutoff at the higher binding energy end of the spectrum. It is well established for conjugated polymers that the HOMO-LUMO gap, or bandgap is set by the energy levels of the bonding π-orbitals and the anti-bonding π-orbitals respectively. This π-π* energy gap is typically low enough to be pushed into the visible portion of the spectrum for longer π conjugation lengths and can be estimated from the low energy cutoff of the absorption spectrum.

In another preferred embodiment the pi-conjugated polymers of this invention allow efficient photoinduced electron transfer from a photoexcited p-type semiconducting polymer. Photoluminescence quenching (PLQ) experiments are a convenient method to determine the efficiency of the electron transfer between two different semiconducting materials of different nature (typically a p-type and n-type). Photoluminescence quenching efficiency higher than 0.1% and more preferably higher that 10% and most preferably higher than 50% are desirable for the fabrication of Organic Photovoltaic devices (Example 9.)

In a preferred embodiment the pi-conjugated organoboron polymers are N-type semiconductors and have a non-negligible (i.e., measurable with current state-of the art equipment) mobility of charge carriers, preferably where the charge carriers are negative charge carriers. Preferred charge carrier mobilities are greater than $10^{-5}$ cm$^2$/V·s with more preferred mobility being greater than $10^{-3}$ cm$^2$/V·s. Preferred carrier densities are greater than $10^6$ cm$^{-2}$ with more preferred carrier densities greater than $10^9$ cm$^{-2}$. Charge carrier type, density, and mobility can be measured by carrying out Hall probe measurements or by using a time of flight laser excitation technique (ASTM F76 from the ASTM book of Standards Version 10.05, 2000). These properties are required when the pi-conjugated organoboron polymers are used for the fabrication of transistors, solar cells and for the electron transport layer of an OLED.

In another preferred embodiment the pi-conjugated organoboron polymers of this invention are fluorescent, electroluminescent and/or emit light under applied bias. Typical fluorescence is green- and/or blue. These properties are required when the pi-conjugated organoboron polymer is the light emitter (Example 5), for example, in a PLED.

In yet another embodiment the pi-conjugated organoboron polymers of this invention are doped to a conducting state. This can be achieved, for example, by reaction with a reducing agent such as an alkali metal hydride, or a solution of sodium naphthalenide, by ion implantation or by electrochemical methods (Antoun, S., and R. D. Gagnon, J. D. Capistran, F. E. Karask, R. W. Lenz., (1987). "Synthesis, doping, and electrical properties of high molecular weight poly(p-phenylenevinylene)," *Polymer*, 28, 587-573, Moliton, A. (1998) "Ion Implantation Doping of Electroactive Polymers and Device Fabrication," in *Handbook of Conducting Polymers, 2$^{nd}$ Ed.*". Ed. T. A. Skotheim, R L Elsenbauer, J. R. Reynolds, Marcel Dekker, New York, p-589-638, Shacklette, L. W., and J. E. Toth, N. S. Murthy, R. B. Baughman, (1985) "Polyacetylene and Polyphenylene as Anode Materials for Non-aqueous Secondary Batteries," *J. Electrochem. Soc.*, 132, 1529-1535). Preferred conductivities are higher than $10^{-6}$ S/cm and most preferred are higher than $10^{-3}$ S/cm. Most preferably, the doping process is reversible and stable (Example 4).

In an embodiment of this invention, coating solutions of pi-conjugated organoboron polymers are prepared by dissolving the polymers in an appropriate solvent at an appropriate concentration. Preferred solvents are alkanes, aromatic hydrocarbons, ethers, alcohols, ketones, esters, nitriles, lactones, nitroalkanes, halogenated alkanes, and supercritical carbon dioxide. The most preferred solvents are benzene, chlorobenzene, toluene, xylenes, pentane, hexanes, cyclohexane, tetrahydrofuran, dimethylformamide, dimethylsulfoxide, N-methylpyrrolidone, dimethylcarbonate, acetonitrile, chloroform, dichloromethane, dichloroethane. The concentration of a coating solution is higher than 0.1 g/L, more preferably higher than 1 g/L and most preferably higher than 10 g/L. Common coatings additives such as rheology modifiers, surfactants, wetting agents, anti-foaming agents, and crosslinkers may be added to coating solutions as an embodiment of this invention. These coating solutions may be used to prepare coatings, patterned coatings, printed circuitry elements, and other device elements or features.

Figure 2:
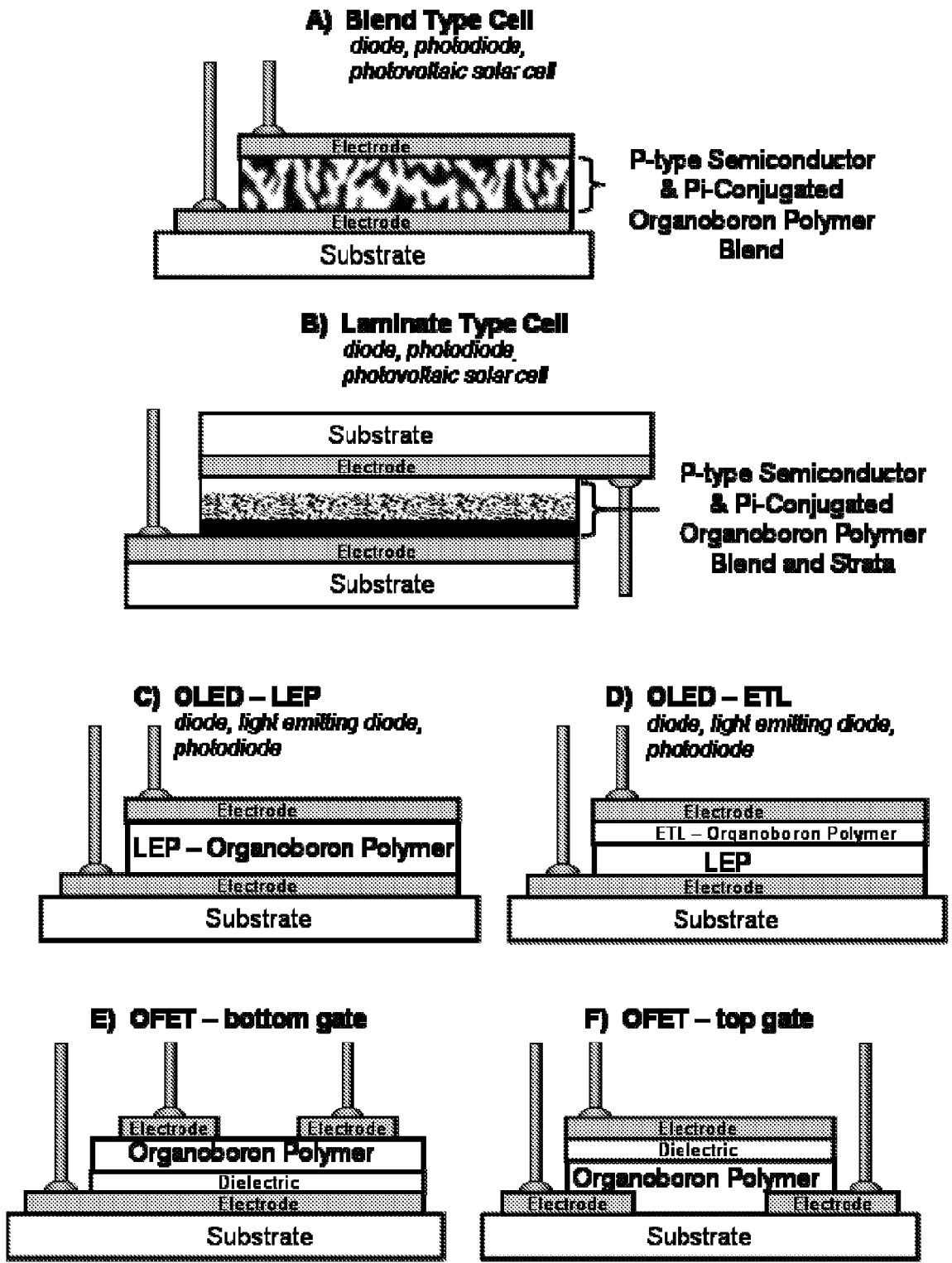
FIG. 2. Exemplary configurations of various thin-film organic polymer electronic devices containing a layer of a pi-conjugated organoboron polymer.

The preferred solubility properties of a given boron-containing conjugated polymer depend on the device design in which the polymer will be used (FIG. 2). In order to construct layered materials, polymers for use in adjacent layers are selected so that their solubility is either orthogonal to each other or similar to each other. The term "orthogonal" with respect to solubility is used to describe the situation where there exists at least one solvent in which one of the two different polymers used in adjacent layers is substantially more soluble than the second polymer under selected conditions (temperature, contact time, etc.) The term "similar" with respect to solubility is used to describe the situation where there exists at least one solvent in which both of the two different polymers are substantially soluble under selected conditions. If polymers for use in adjacent layers have substantially similar solubility in a given solvent, partial or complete mixing of the two layers at the interface can occur during spin casting or dip coating. The different polymers need not exhibit the same level of solubility in the given solvent under the selected conditions. They need only have sufficient solubility in the solvent to obtain the level of mixing desired. If the solubility of the polymers for use in adjacent layers is substantially orthogonal, then no significant level of mixing occurs in a given solvent under selected conditions.

Again dependent upon device design and application, mixing of the adjacent layers may be a desirable property (e.g., laminate cell device of FIG. 2B) or a highly undesirable property (e.g., cell devices of FIG. 2 C-F). In these cases the underlying layers are cast from polar or aqueous solvents and therefore the organoboron polymer is preferred to be soluble in non-polar solvents. For these reasons it is desirable to control and change the solubility properties of organoboron polymers for use in device applications herein. This is achieved by selecting the nature of the polymer side chains, by selecting functional groups for inclusion on the polymer side chains and by selecting the average molecular weight of the polymer itself. Tunable solubility properties of polymers also facilitate the preparation of ideal blends of the n-type boron-containing conjugated polymers with other p-type conjugated polymers for use in photodiodes and photovoltaic solar cells. Ideal blends contain phase-separated domains of the p-type and n-type materials, wherein the domains of each phase are preferably small (less than 1 micron, more preferably less than 100 nm, and most preferably less than 10 nm) and have a fractal surface to maximize the surface area (interface) that separates the two materials. Maximizing the interface in such devices can be beneficial because light generation (in OLEDs and PLEDs) and charge separation (i.e. creation of current in photovoltaic devices) occur at the interface.

In a preferred embodiment of this invention, coating solutions may contain more than one polymer, for example they may contain two or more pi-conjugated organoboron polymers or a mixture of a pi-conjugated organoboron polymer with one or more other pi-conjugated, conducting or semi-conducting polymers (that are not organoboron polymers) or non-polymeric molecules. In a more preferred embodiment of this invention a coating solution may be prepared with one or more pi-conjugated organoboron polymer and one or more p-type conducting or semiconducting polymers that are not organoboron polymers, p-type conducting or semiconducting non-polymeric molecules, or p-type conducting or semiconducting particulate solids. P-type conducting or semiconducting particulate solids with physical dimensions smaller than 10 microns are preferred. Regioregular poly(n-alkyl thiophene)s are examples of organic p-type semiconducting polymers, zinc phthalocyanine and hexathiophene are examples of p-type molecules and nano-crystalline boron-doped silicon, p-type gallium arsenide and p-type zinc telluride are example of inorganic p-type semiconductors.

Thin-films of this invention can contain polymer blends. Polymer blends are macroscopically homogenous mixtures of two or more measurably different polymers (noting that polymers themselves are mixtures of polymer molecules). The polymers may be miscible, but need not be miscible. Blends may contain different phase domains in contrast to miscible polymer mixtures that contain a single phase.

In an embodiment of this invention a thin film of either an end-capped or non-end-capped pi-conjugated organoboron polymer or containing such a polymer is formed by application of a coating solution to a substrate material by appropriate means. Preferred methods include spin coating, dip coating, contact printing, ink-jetting, screen printing, and airbrushing. Removal of the coating solution solvent is preferably carried out by evaporation with heating of the film to a temperature in the range from room temperature to 250 degrees Celsius and more preferably from 50 to 150 degrees Celsius for 5 to 30 minutes. Most preferably the thin film is annealed at 80 to 110 degrees Celsius for 5 to 10 minutes. If supercritical fluids are employed as the solvent, temperatures below room temperature may be used. Drying and annealing can be accomplished in air, but more preferably is carried out under a flow of dry nitrogen or argon. Dried thin films have a preferred thickness of 10 to 10,000 angstroms and a preferred thickness of 100 to 5,000 angstroms and a more preferred thickness of 500-3,000 angstroms.

In a preferred embodiment of this invention, thin films are prepared on a substrate, which can be a glass, ceramic, plastic, paper, textile, or metal substrate. These substrates can be of any useful thickness and surface roughness. Preferred plastic substrates are polyethylene, polypropylene, other polyolefins, polyesters, polyacrylates, polycarbonates, polyvinylchloride, polyvinylalcohol, polyvinylacetate, other vinyl polymers and copolymers, polysulfones, polyamides, polyimides, polyolefins, cellulose, cellulose acetate, Kapton, Kevlar, and perfluorinated polymers. Optionally these substrates may be coated with any useful thickness of films of metals, metal oxides, semiconductors, dielectric materials, conducting polymers, or semiconducting polymers. These films may be applied by any known means and completely cover the substrate or be patterned by any known means so as to provide the proper electrical properties and connections for the operation of devices of this invention. In a preferred embodiment of this invention the substrate may itself act as one or more electrodes for the operation of devices of this invention. In a preferred embodiment of this invention the substrate is glass or plastic coated with a transparent, conducting oxide film comprising tin-doped indium oxide or fluorine-doped tin oxide. In another preferred embodiment of this invention the substrate is glass or plastic coated with a transparent, conducting polymer comprising polythiophene, polypyrrole, polyaniline, or derivatives thereof (see Orgacon products by Agfa, Ormecon products by Ormecon, or Baytron products by H. C. Starck).

Objects of this invention include thin-film, organic polymer electronic devices that comprise one or more active layers and at least two electrodes in contact with the active layer or layers, wherein the electrodes provide a means by which a current or a voltage is either applied to or derived from the active layer or layers. The active layer or layers comprise at least one thin film of an organic polymer. When only one active layer exists, that layer comprises a pi-conjugated organoboron polymer. When the active layers comprise more than one layer, then at least one of the active layers is a pi-conjugated organoboron polymer. Examples of various organic polymer electronic devices containing an active layer of a pi-conjugated organoboron polymer are in FIGS. 2A-F.

FIGS. 2A and B schematically illustrate device configurations useful particularly for diodes, photodiodes or photovoltaic solar cells. FIG. 2A is a bended cell type device configuration (10a) in which the active layer 5 is a thin film of a polymer blend, e.g., a p-type semiconductor polymer and a pi-conjugated organoboron polymer blend. The active layer (5) is positioned between and separating two electrode layers (7a and 7b) which are in electrical communication with two contacts (9a, 9b). FIG. 2A illustrates a device constructed with a single substrate layer (11a).

FIG. 2B illustrates a laminated-type cell device configuration in which the active layer 5 comprises one or more thin-film layers (multiple strata). This device configuration contains two substrates (11a and 11b). Again the active layer separates two electrodes (7a and 7b) each of which is in electrical communication with contacts (8a and 8b) respectively.

FIGS. 2C and D illustrate exemplary device configurations useful for diodes, light-emitting diodes and photodiodes. In FIG. 2C, the device is constructed with a single substrate (11a), the active layer (5) is a light-emitting polymer layer which comprises a pi-conjugated organoborane polymer that is light-emitting. The active layer separates two electrodes (7a and 7b). The electrodes are in electrical communication with two electrical contacts (8a and 8b), respectively. In FIG. 2D, a two substrate device configuration is illustrated. The active layer 5 comprises multiple layers, including an electron transfer layer (15) which comprises a pi-conjugated organoborane polymer and a light-emitting polymer layer (17) comprising a light-emitting species, e.g., a light emitting polymer (this polymer may or may not comprise or be a pi-conjugated organoborane polymer.)

FIG. 2E illustrates a device configuration for an OFET-bottom gate. Both configurations contain two substrates (11a and 11b). The active layer 5 is positioned between a bottom electrode (7a) and two separate top electrodes (7b and 7c). The configuration has three contacts (8a, 8b and 8c) in electrical communication with each electrode, respectively. The active layer 5 comprises a dielectric layer (19) adjacent to the bottom electrode and a pi-conjugated organoboron polymer comprising the layer (21) between the dielectric layer and in contact with top electrodes (7b and 7c).

FIG. 2F illustrates a device configuration for an OFET-top gate. The active layer 5 is positioned between a top electrode (7a) and two separate bottom electrodes (7b and 7c). The active layer 5 comprises a dielectric layer (19) adjacent the top electrode and a pi-conjugated organoboron polymer comprising the layer (21) between the dielectric layer and in contact with bottom electrodes (7b and 7c).

It will be appreciated by those of ordinary skill in the art that the pi-conjugated organoboron polymers and thin films comprising them can be employed in additional device configurations.

A more preferred object of this invention is a thin film, organic polymer electronic device that is comprised of at least one p-type semiconducting organic polymer layer and at least one n-type, pi-conjugated organoboron polymer (as exemplified in FIGS. 2A and B). One or more electrode may constitute the substrate onto which the organic polymer thin films are applied, or may be applied as a layer on top of the thin film, organic polymer layers. In a preferred embodiment of this invention, electrodes comprise metals, metal oxides, semiconductors, conducting polymers, semiconducting polymers or mixtures thereof. These electrode contacts may be applied by any known means and completely cover the organic polymer layers or be patterned by any known means so as to provide the proper electrical properties and connections for the operation of devices of this invention. In a more preferred embodiment of this invention the electrode contacts are applied by thermal or physical vapor phase deposition of aluminum, aluminum fluoride, copper, nickel, gold, silver, magnesium, calcium, barium, zinc, titanium, titanium oxide, fluorine-doped tin oxide, antimony-doped tin oxide, tin-doped indium oxide, aluminum doped zinc oxide, or mixtures thereof.

In one embodiment of this invention a thin-film of the pi-conjugated organoboron polymer layer is used as the ETL in OLEDs, PLEDs and other light emitting diodes to control the current of injected electrons (from the cathode) such that they are balanced with the current of injected holes (from the anode) under forward bias (FIG. 2D). During such use of the pi-conjugated organoboron polymer layer as an ETL, the device design may additionally allow for light emission to occur (by singlet recombination of electrons and holes) in this same layer. Therefore the pi-conjugated organoboron polymer layer may be used as both an ETL and a light-emitting polymer layer for PLEDs (FIG. 2D). In another embodiment of this invention a thin film of the pi-conjugated organoboron polymer is used as the light-emitting layer of a PLED optionally in combination with a layer of a different material that acts as the ETL (FIG. 2D).

In other embodiments of this invention, the pi-conjugated organoboron polymer layer is similarly useful as the n-type semiconductor and/or ETL in photodiodes. Such devices are similar in design to PLEDs, but are typically operated under reverse bias where photons produce a measurable induced photocurrent (by photo-induced charge transfer and separation at the interface of the p-type and an n-type semiconductor layers).

In additional embodiments of this invention, the pi-conjugated organoboron polymer layer is similarly useful as the n-type semiconductor and/or ETL in OPVs. Such devices are similar in design to diodes, but are more preferably constructed with active layers from blends of p-type and n-type semiconducting polymers rather than separate layers of the p-type and n-type semiconducting polymers. This blended active layer maximizes the surface-to-volume ratio of the interface between p-type and n-type semiconducting polymers where photo-induced charge transfer and separation occurs, which is responsible for the generation of power in these devices (FIGS. 2 A and B, Examples 1, 2 and 4).

In further embodiments of this invention, the pi-conjugated organoboron polymer layer is similarly useful as the n-type semiconductor for the active layer in TFTs and OFETs (FIGS. 2 E and F). TFTs and OFETs may comprise a single semiconductor (n- or p-type) or multiple semiconductors as in patterned p-n-p or n-p-n junctions. Additional uses of n-type semiconductors in thin film electronic devices are known by those skilled in the art. Pi-conjugated organoborane polymers having n-type semiconductor properties of this invention can be employed in all such applications.

When a group of substituents is disclosed herein, it is understood that all individual members of that group and all subgroups, including any isomers, enantiomers, diastereomers, and epimers of the group members, are disclosed separately. When Markush groups or other groupings are used herein, all individual members of the group and all combinations and subcombinations possible of the various individual members of the various groups are intended to be individually included in the disclosure and useful in the practice of the invention. When a compound is described herein such that a particular isomer, enantiomer, diastereomer or epimer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical research related to the molecule or its use. Isotopic variants of molecules (or mixtures thereof) can exhibit distinct properties in certain applications. Methods for making such isotopic variants are known in the art. Specific names of compounds are intended to be exemplary, as it is known that one of ordinary skill in the art can name the same compounds differently.

Formulas of polymeric species disclosed herein may contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when a compound is claimed, it should be understood that compounds known and available in the art prior to Applicant's invention, including compounds for which an enabling disclosure is provided in the references cited herein, are not intended to be included in claims to compounds herein. However, certain compositions claimed herein may contain components which are in the prior art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, reagents, synthetic methods, purification methods, analytical methods, assay methods, methods for coating, methods for preparation of thin films, methods for preparation of devices, device configurations and methods for testing device configurations other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

All references cited herein are hereby incorporated by reference to the extent that there is no inconsistency with the disclosure of this specification. Some references provided herein are incorporated by reference to provide details concerning sources of starting materials, additional starting materials, additional reagents, additional methods of synthesis, additional methods of analysis, device configurations, methods for use of devices and additional uses of the invention.

THE EXAMPLES

Example 1

Synthesis of Poly(arylboranes)

Poly(arylborane)s were prepared in a two-step synthesis from commercially available starting materials according as illustrated in Scheme 9; first two different borane reagents were prepared with a mesityl or tripyl group (step A), then the borane reagent was polymerized with an aromatic dibromo compound after transforming it into its Grignard reagent (step B). Representative syntheses are given below.

Scheme 10 shows the structure of the polymers prepared in this way, six with mesityl substituents on the boron atoms (x series) and seven with tripyl substituents (y series). Seven different dibromo-aromatic compounds were used as the starting materials: 5,5'-dibromobithiophene (polymers 3a), 2,5-dibromo-3-hexyl-thiophene (polymers 3b), 1,4-dibromo-2,5-bis(decyloxy)benzene (polymers 3c), 9,9-dihexyl-2,7-dibromofluorene (polymers 3d), 9,9-didodecyl-2,7-dibromofluorene (polymers 3e), 2,5-dibromo-3-dodecyl-thiophene (polymers 3f), and 9,9-diisooctyl -2,7-dibromofluorene (polymers 3g). The structures of all the intermediates and polymers were confirmed by $^1$H-NMR analysis. The occurrence of the coupling reaction (step 2) was confirmed by the disappearance of the $^1$H-NMR signal corresponding to the methoxy protons of the borane reagent at 3.6 ppm. The $^1$H-NMR spectra of some of the polymers showed the presence of tetrahydrofuran (THF, the solvent used in the polymerization) in about one molar equivalent with respect to boron atoms suggesting that a significant fraction of the boron atoms of the polymers are coordinated to a molecule of solvent. Gel permeation chromatography results indicated that these materials have a broad molecular weight distribution ranging from a few repeat units to greater than 60 repeat units.

All of the prepared polymers were colored viscous oils with the exception of 3ay and 3by which were colored powdery solids. The polymers were at least partially soluble in THF and chloroform with exception of polymer 3dx, which was insoluble in these solvents. The fluorene derivatives 3dx, 3dy, 3ex, 3ey and 3gy were soluble in toluene or ortho-xylene and the thiophene derivatives were soluble in THF, acetonitrile and chloroform. All the prepared polymers were found to be air stable for an extended period of time (at least three months).

Scheme 9. Synthesis of poly(arylborane)s.

Step A:

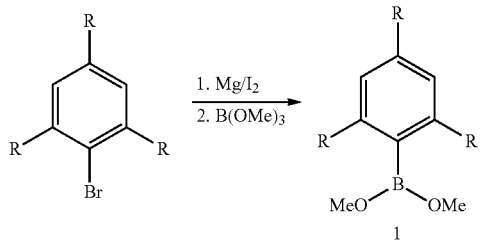

x = R = Me
y = R = iPr

Step B:

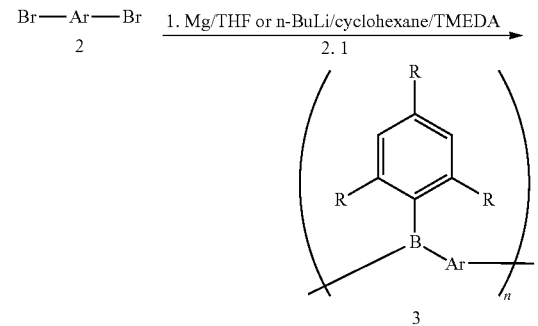

Scheme 10: Structure and properties of pi-conjugated organoboron polymers produced by the methods in Examples 3 and 4.

| Structure | Mesityl derivative (3?x) | Tripyl Derivative (3?y) |
| --- | --- | --- |
| ![3ax/3ay structure]<br>3ax (R = Me)<br>3ay (R = iPr) | Brown viscous oil<br>Green fluorescence | Brown powder<br>Green fluorescence |

-continued

Scheme 10: Structure and properties of pi-conjugated organoboron polymers produced by the methods in Examples 3 and 4.

| Structure | Mesityl derivative (3?x) | Tripyl Derivative (3?y) |
|---|---|---|
| 3bx (R = Me)<br>3by (R = iPr) | Brown viscous oil<br>Blue-green fluorescence | Yellow-brown powder<br>Green fluorescence |
| 3cx (R = Me)<br>3cy (R = iPr) | Brown viscous oil<br>Blue-green fluorescence | Brown viscous oil<br>Blue-green fluorescence |
| 3dx (R = Me)<br>3dy (R = iPr) | Yellow viscous oil<br>Blue fluorescence | Yellow viscous oil<br>Blue fluorescence |

Scheme 10: Structure and properties of pi-conjugated organoboron polymers produced by the methods in Examples 3 and 4.

| Structure | Mesityl derivative (3?x) | Tripyl Derivative (3?y) |
|---|---|---|
| 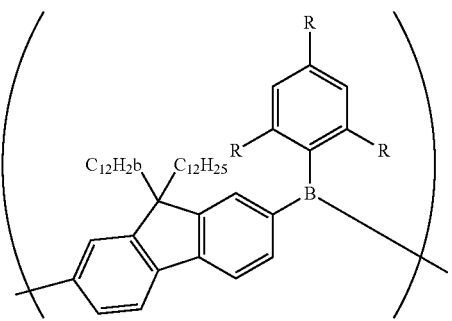<br>3ex (R = Me)<br>3ey (R = iPr) | Yellow viscous oil<br>Blue fluorescence | Yellow viscous oil<br>Blue fluorescence |
| 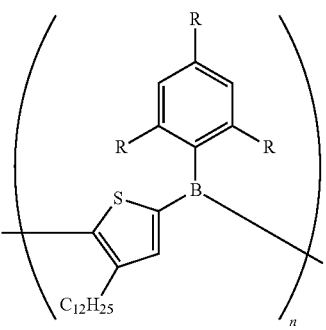<br>3fx (R = Me)<br>3fy (R = iPr) | Brown viscous oil<br>Blue-green fluorescence | Brown viscous oil<br>Blue-green fluorescence |
| 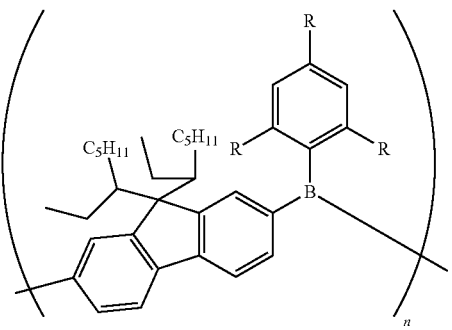<br>3gx (R = Me)<br>3gy (R = iPr) | | Yellow viscous oil<br>Blue fluorescence |

Elemental analysis data combined with $^1$H-NMR data confirmed that all the polymers with the exception of 3by contained alternating aromatic and boron repeat units (i.e. had structure of the type of Scheme 2A, formula b) and that the aromatic unit terminated the polymer at least on one side. Elemental analysis indicated that polymer 3by contained an excess of sulfur indicating that this polymer may contain short segments of homopolymerized 3-hexylthiophene (Scheme 2A, formula h, with n equal to about 1 and m equal to about 3).

The photoluminescence emission spectra were recorded for each polymer using an excitation wavelength of 230 nm with a Shimadzu RF-1501 Spectrofluorometer in chloroform, THF, cyclohexane or dimethylsulfoxide (DMSO). The emission maxima in chloroform are given in Table 1. The location of the emission maxima were independent of the excitation wavelength, but showed a strong dependence on solvent polarity. For instance, 3by exhibited a blue shifted emission ($lambda_{max}$=492 nm) in less polar THF and red shifted emission in polar DMSO ($lambda_{max}$=533 nm).

TABLE 1

Optical properties of organoboron polymers in chloroform.

| | Absorbance ($\lambda_{max}$) | Emission ($\lambda_{max}$) |
|---|---|---|
| 3ax | 330, 440 | 394, 774 |
| 3ay | 455, 477 | 481 |
| 3bx | 340 | 443 |
| 3by | 240, 300, 402 | 337, 431, 672, 859 |
| 3cx | 230, 360 | 302, 464 |
| 3cy | 450, 479 | 465 |
| 3dx | 230, 320 | 419, 791 |

Synthesis of the Borane Reagents (1x,y)

Dimethoxymesitylborane (1x): To a stirred solution of magnesium turnings (3.11 g, 0.128 mol) and a crystal of iodine, 2-bromomesitylene (23.40 g, 0.118 mol) in THF (80 cm$^3$) was added dropwise at room temperature. The reaction was allowed to reflux for 3 hours. After the reaction mixture was cooled, it was added dropwise to an ether solution (80 cm$^3$) of trimethoxyborane (26 cm$^3$, 0.229 mol) at −15° C. The reaction was stirred at −15° C. for 3 hours, was warmed to room temperature, and left to stir overnight. The solution was then filtered under argon and the precipitated salts were washed with dry pentane (20 cm$^3$). The filtrates were combined, concentrated and distilled under vacuum to give dimethoxymesitylborane 1x. $^1$H NMR (200 MHz, CDCl$_3$) 2.28 ppm (s, 6H), 2.30 ppm (s, 3H), 3.58 ppm (s, 6H), 6.84 ppm (s, 2H).

Synthesis of Polymers (3a-3e) in THF

To a clean dry round bottom flask, the borane reagent 1 (2 mmol, 1 eq.), the commercially available aromatic dibromide 2 (2 mmol, 1 eq.) and magnesium turnings (4 mmol, 2 eq.) were added to 15 cm$^3$ of THF. The reaction was allowed to reflux for 24 to 72 hours depending on the substrates. Color change and photoluminescence generally indicated the completion of the reaction. The reaction was cooled to room temperature and a few drops of methanol were added. The solvent was removed and the obtained gum was dissolved in a minimal amount of chloroform and then precipitated in methanol. The insoluble part was centrifuged down and washed repeatedly with methanol. The solvent was removed in vacuo.

Synthesis of Polymers (3a-3e) in Cyclohexane

To a stirred solution of the commercially available dibromide 2 in anhydrous cyclohexane (dried over calcium hydride) 1 eq. of n-butyllithium (n-BuLi) and 1 eq. of tetramethylethylenediamine (TMEDA) were added at −15° C. The mixture was warmed to room temperature for 15 minutes (to ensure the formation of the lithio compound) and then cooled back to −15° C. A solution of the borane reagent 1 in cyclohexane was added to the reaction mixture dropwise over 30 minutes. The reaction was stirred at room temperature for 48 hours. Color change and photoluminescence indicated the completion of the reaction. Methanol (~10 cm$^3$) was added to quench the reaction. The solution was gravity filtered to remove all the precipitated salts. The solvent was removed in vacuo. $^1$H-NMR showed no methanol in the sample, suggesting that the boron is free from coordination.

Synthesis of 3f and 3g in THF Via Lithio Compound

To a stirred solution of the commercially available aromatic dibromide 2 in anhydrous THF was added 2 eq. of n-butyllithium (n-BuLi) at −78° C. The mixture was warmed to room temperature for 15 minutes (to ensure the formation of the dilithiated compound) and then cooled back to −78° C.

A solution of the borane reagent 1 in THF was added to the reaction mixture dropwise over 5 minutes. The reaction was stirred at room temperature for 48 hours. Color change and photoluminescence indicated the completion of the reaction. Methanol (~10 cm$^3$) was added to quench the reaction. The solution was gravity filtered to remove all the precipitated salts. The solvent was removed in vacuum. 3fx and 3fy were both brown gums and had blue-green photoluminescence. 3gy was a yellow gum and had blue photoluminescence.

Example 2

Synthesis of Poly(vinylborane)s

Poly(vinylborane)s were synthesized by reacting trans-1,2-bis(tributyltin)ethene with dichloroboranes (Scheme 11). $^1$H-NMR and elemental analysis indicated that the desired products were formed.

Scheme 11

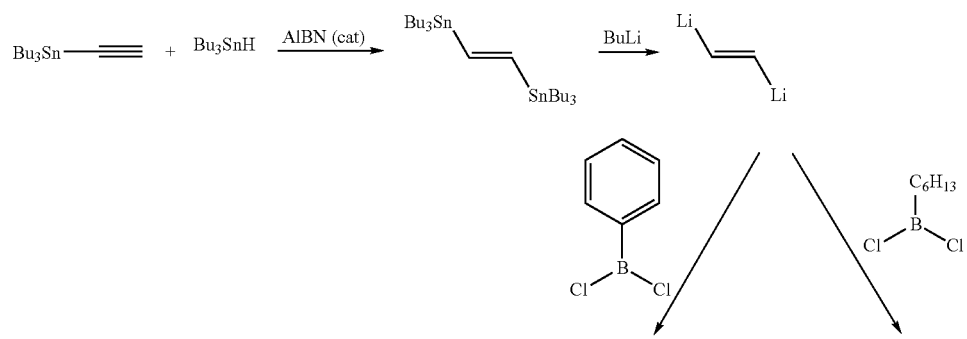

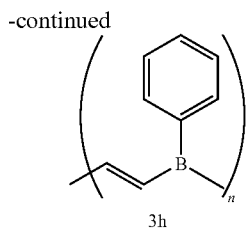
3h

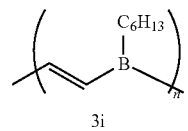
3i

Synthesis of trans-1,2-bis(tributyltin)ethene

Tribuytyltin hydride (3.15 g, 10.8 mmol) and ethynyltributylstannane (3.4 g 10.8 mmol) and a catalytic amount of azobisisobutyronitrile (AIBN) were heated at 90° C. for 10 hours under an inert argon atmosphere. The reaction was vacuum distilled and the product was obtained in 95% yield.

Synthesis of Dichlorohexylborane

A solution of 1.91 g (16.25 mmol) of boron trichloride and 1.37 g (2.03 mL, 16.25 mmol) of 1-hexene in 5 cm$^3$ of pentane was stirred under argon at −78° C. for 15 minutes. Tributylsilane (3.26 g, 16.25 mmol) was added dropwise to the stirred reaction mixture and left to stir overnight at room temperature. Vacuum distillation yielded dichlorohexylborane in 90% yield.

Synthesis of 3i and 3h

To a stirred solution of the trans-1,2-bis(tributyltin)ethene in anhydrous THF was added 2 eq. of n-butyllithium (n-BuLi) at −78° C. The mixture was warmed to room temperature for 15 minutes (to ensure the formation of the di-lithiated compound) and then cooled back to −78° C. A solution of the dichloroborane reagent in THF was added to the reaction mixture dropwise over 5 minutes. The reaction was stirred at room temperature for 48 hours. Color change indicated the completion of the reaction. Methanol (~10 cm$^3$) was added to quench the reaction. The solution was gravity filtered to remove all the precipitated salts. The product was washed with chloroform and the solvent was removed in vacuum.

Example 3

Electrochemical Doping

To identify the n-type semiconducting behavior of these polymers, we cast thin films onto a platinum working electrode and subjected these films to cyclic voltammetry. FIG. 1 shows the reduction of the 3ay polymer under an argon atmosphere. N-type behavior is generally indicated by a facile reduction process (electron injection) of the film on the electrode surface. We observe a reduction process in our materials, however, this reduced or n-doped form of the material is unstable or highly soluble because no film remains on the electrode after reducing the film.

Example 4

Doping with Sodium Naphthalenide (NaNp)

To a solution of naphthalene (150 mg, 1.17 mmol) in anhydrous THF (~40 cm$^3$), was added sodium metal (30 mg, 1.3 mmol) at room temperature under an argon atmosphere. The mixture was allowed to stir for 2 hours. The resulting dark green solution was added dropwise via cannula to the stirred polymer in THF. The solution was allowed to stir for 30 minutes at room temperature.

The polymers 3cy, 3dx, 3ex, and 3ey dramatically changed color upon adding sodium naphthalenide from a pale yellow to a dark purple-black or greenish-black color and lost their characteristic photoluminescence, indicating that reduction of the polymers has occurred, presumably by formation of a radical anion. Upon exposing the polymers to air (even in trace amounts) the polymers returned to their original colors and regained their photoluminescence, confirming that the reduction is a reversible process, i.e. that this is effectively a doping process and not an irreversible chemical reduction of the polymer chain.

Example 5

Device Fabrication and Testing

Poly(bithienyl-tripylborane) (polymer 3ay) was used for the fabrication of OLED prototypes. The device design is shown in FIG. 2C and comprises a layer of patterned ITO as the anode, a thin film of PEDOT/PSS as the hole injecting layer, our pi-conjugated organoboron polymer, and an aluminum cathode. The devices were fabricated using a clean room facility. ITO was patterned according to well-known photolithographic masking and etching methods. A 50 nm layer of PEDOT/PSS was spin coated at 2000 RPM from a freshly filtered commercially available solution of this material (Baytron P, electronic grade VP Al 4083, H. C. Starck) as a hole injection layer. After annealing at 100 C for 30 minutes, a 200 nm layer of the pi-conjugated organoboron polymer was spin coated at 2000 RPM from freshly filtered chloroform solution. To complete the devices, a top layer of aluminum was deposited by thermal vapor deposition on top of the organoboron polymer. The operation and light output of devices of were tested by application of a supplied voltage and evaluated by visual inspection. The anode and cathode were connected to the outputs of a 30 V DC power supply. The voltage between the anode and cathode was increased manually until there was an observed output of light. The voltage at which this occurred was recorded at 6-7 V for a number of devices tested. The color of the light output was yellow-green light. The turn-on voltage of this un-optimized device in air was around 6-7 Volts. Those skilled in the art know that device optimization will result in a decrease of the turn-on voltage. As known in the art, quantification of the light output and lifetime of the device can be readily measured employing art known techniques, and standard instrumentation such as a direct current (DC) source coupled to a metering device, a photodiode, a photomultiplier, an integration sphere and laboratory software. Complete OLED/PLED test systems are now commercially available (for example the Eclipse test system from Cambridge Display technologies, LTD.http//www.cdtltd.co.uk/).

Example 6

Device Fabrication and Testing

Figure 3:
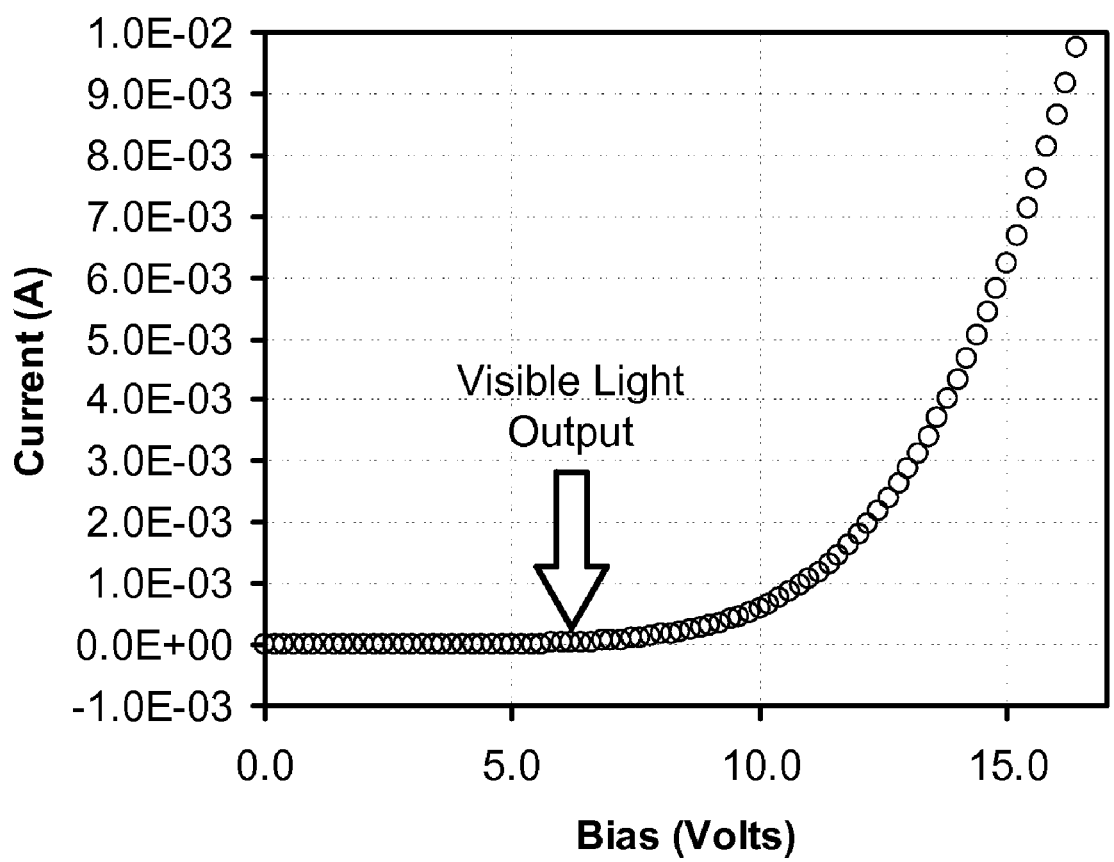
FIG. 3. Current versus voltage response of a MEH-PPV diode with a 3by polymer layer acting to transport electrons.

To test the electron transport properties of these materials we constructed a diode with the structure illustrated in FIG. 2D, using a known light emitting polymer, poly(2-methoxy-5-(2'-ethylhexyloxy)-1,4-phenylenevinylene) (MEH-PPV). The device structure consisted of glass\ITO\Baytron P\MEH-PPV\organoboron polymer 3by\aluminum. The current-voltage characteristics of these devices were monitored and light output was visually confirmed. FIG. 3 shows the current versus voltage data obtained for a device containing a ca. 100 nm thick 3by ETL.

Example 7

Synthesis of Poly(thiazole-mesitylborane) by Reaction of Dibromothiazole and 1x (Scheme 3) in THF To a clean dry round bottom flask, the borane reagent 1x (8.2 mmol, 1 eq.), the commercially available aromatic dibromide, 2,5-dibromothiazole (8.2 mmol, 1 eq.) and magnesium turnings (16.4 mmol, 2 eq.) were added to 24 cm³ of anhydrous THF. The reaction was allowed to reflux under an inert atmosphere for 72 hours. Color change and polymer precipitation generally indicated the completion of the reaction. The reaction was cooled to room temperature and a few drops of methanol were added. The solvent was removed and the brown polymer obtained was dissolved in a minimal amount of N,N-dimethylformamide and then precipitated in methanol. The insoluble precipitate was centrifuged down and washed repeatedly with methanol. The solvent was removed in vacuo to provide the poly(thiazolemesitylborane).

Example 8

End Capped Poly(2,5-didodecyloxybenzene mesitylborane)

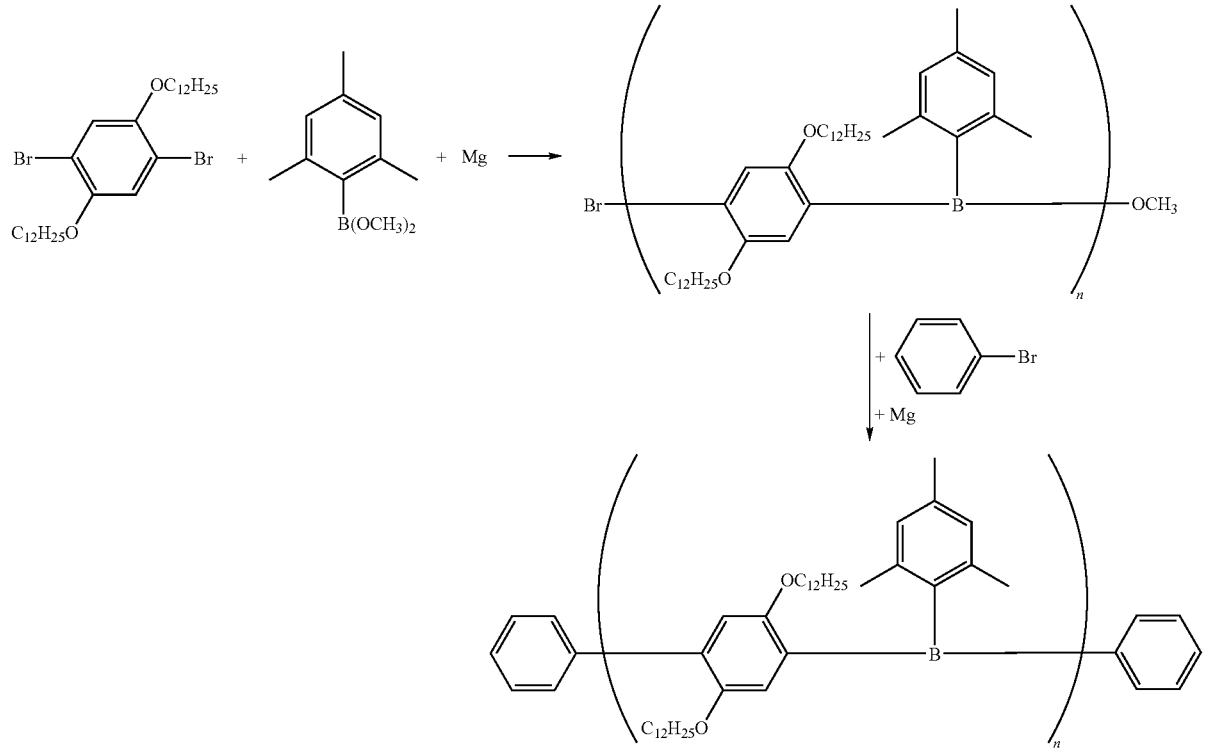

Synthesis of Dimethoxymesitylborane: To a stirred solution of activated magnesium flakes (3.11 g, 0.128 mol) and a crystal of iodine, 2-bromomesitylene (23.40 g, 0.118 mol) in THF (80 cm³) was added dropwise at room temperature. The reaction was allowed to reflux for 3 hours. After the reaction mixture was cooled, it was added dropwise to an ether solution (80 cm³) of trimethoxyborane (26 cm³, 0.229 mol) at −15° C. The reaction stirred at −15° C. for 3 hours and then was warmed up to room temperature and left to stir overnight. The solution was then filtered under argon and the precipitated salts were washed with dry pentane (20 cm³). The filtrates were combined, concentrated and distilled under vacuum to give the desired dimethoxymesitylborane. $^1$H NMR (200 MHz, CDCl$_3$) δ 2.28 (s, 6H), 2.30 (s, 3H), 3.58 (s, 6H), 6.84 (s, 2H).

Polymerization: To a clean dry round bottom flask, the dimethoxymesitylborane (3.8 mmol, 1 eq.), the commercially available 1,4-dibromo -2,5-didodecyloxybenzene (3.8 mmol, 1 eq.) and activated magnesium flakes (8.4 mmol, 2.2 eq.) were added to 25 cm³ of anhydrous THF. The reaction was allowed to reflux for a minimum of 72 hours. Color change and fluorescence generally indicated the positive progress of the reaction.

End-capping After 72 hours bromobenzene (2 g) was added to the reaction mixture and the reaction was allowed to reflux for an additional 2-3 hours.

Purification. The product was poured in diethylether and the supernatant was decanted under inert atmosphere. The polymer was then crushed with a nonprotic polar solvent and redissolved in ethyl ether.

Characterization. The product of the reaction was an orange waxy solid that was very soluble in THF, chloroform and chlorobenzene. Solubility in chlorobenzene was at least 12 g/L or higher. Combined results from ultraviolet photoemission spectroscopy (UPS) and UV-Visible Spectroscopy indicated that this end capped organoboron polymer had the highest occupied molecular orbital (HOMO) at an energy of −6.2 eV compared to the energy of the vacuum and the lowest unoccupied molecular orbital (LUMO) at an energy of −3.2 eV compared to the energy of the vacuum. The polymer bandgap was determined to be 2.95 eV by UV-Vis spectroscopy.

Thin-film organic photovoltaic fabrication. A photovoltaic device was made by blending this end capped organoboron polymer with the donor semiconducting polymer poly[2-methoxy-5-(3,7-dimethyloctyloxy)-1,4-phenylenevinylene] ($OC_1C_{10}$-PPV), 3:1 by weight. The mixture was dissolved in chlorobenzene at 12 mg/mL and spin coated at 1000 rpm. ITO/PEDOT:PSS was used as the positive electrode, and Ca/Al was used as the negative electrode. The device was illuminated under AM 1.5 and it generated a small photocurrent with open circuit voltage of 0.9887 Volts.

Example 9

Poly(diethynylbenzene tripylborane)

Synthesis of Tripylborane

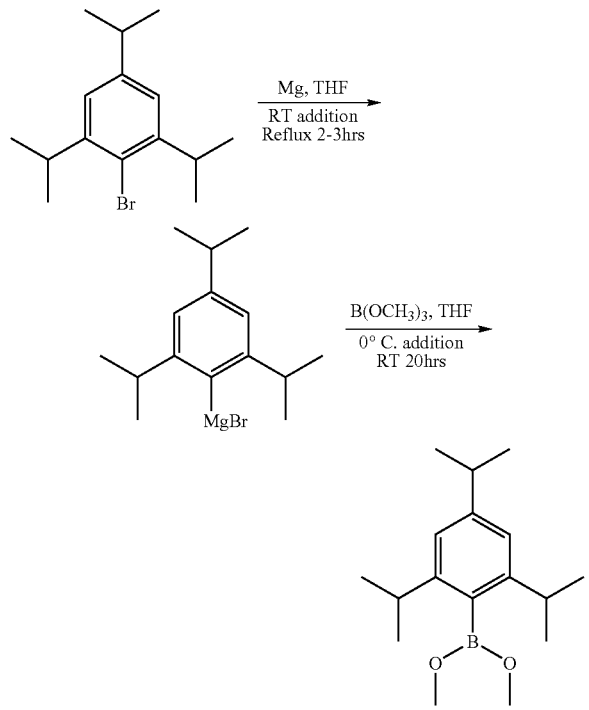

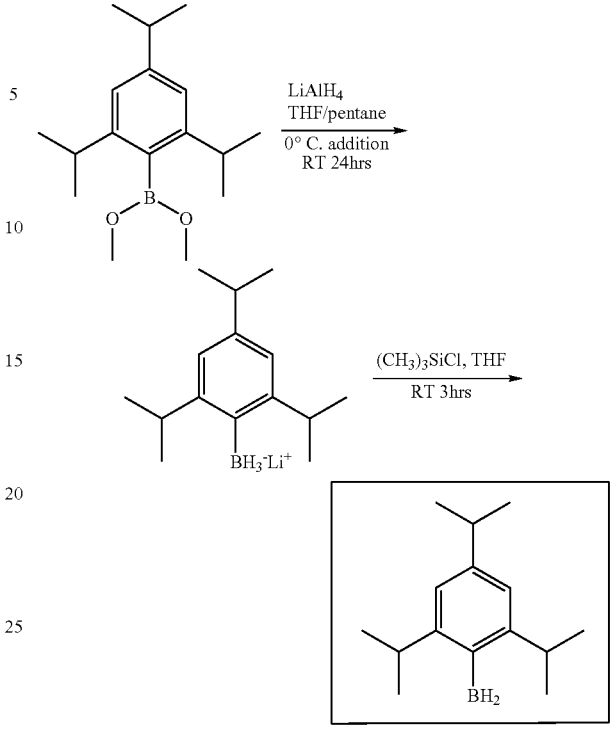

A 250 mL three-neck round bottom flask, magnetic stirbar, condenser, and addition funnel was assembled hot. Magnesium turnings (0.858 g, 35.3 mmol) were added to the flask along with a crystal of iodine and the system was allowed to cool to room temperature under argon purge. Once cool, a heat gun was used to heat the flask until the iodine crystal volatilized. The system was once again cooled to room temperature and anhydrous tetrahydrofuran (approx. 30 mL) was transferred by cannula to the flask. Next, 2-bromo-1,3,5-triisopropylbenzene (10.000 g, 35.3 mmol) was added by syringe to the addition funnel. The aryl bromide was then added dropwise to the magnesium solution. Occurrence of the reaction was evident from the consumption of magnesium turnings, frothing of the boiling solution, and change in color of the solution. The reaction was allowed to proceed for an additional 2 hours and was then cooled to room temperature.

Formation of dimethoxytripyl borane: A 500 mL three-neck round bottom flask, magnetic stirbar, addition funnel, and Shlenk filter with flask was assembled hot. The system was allowed to cool to 0° C. (ice bath) under argon purge. Once cool to 0° C., trimethyl borate (9.172 g, 88.3 mmol) was added by syringe to the flask and the Grignard solution prepared in the previous step was transferred by cannula to the addition funnel. Tetrahydrofuran (150 mL) was added by cannula to the trimethyl borate. The Grignard solution was then added dropwise to the borate, immediately causing the formation of a white precipitate (magnesium salts). After the addition, the reaction was heated to room temperature and stirred overnight. The reaction was then filtered through the Shlenk filter, separating the white solid from the clear solution. The filtrate was washed twice with 10 mL pentane and the supernatant flask was removed from the system, sealed with a septum and purged with Argon. The supernatant was a light yellow clear solution that temporarily clouded with the addition of pentane. The solvents were removed by rotary evaporation, leaving behind a yellow oily solid. The product was vacuum distilled at 74-78° C. Proton NMR confirmed the formation of the desired product.

Formation of lithium trihydrotripyl borane: A 500 mL three-neck round bottom flask, magnetic stirbar, addition funnel, and Shlenk filter with flask were assembled hot and allowed to cool under argon purge. Once cool, lithium aluminum hydride (0.7459 g, 19.65 mmol) was added to the flask and dimethoxytripyl borane (5.250 g, 19.01 mmol) was added by syringe to the addition funnel. Next, tetrahydrofuran (150 mL) and pentane (40 mL) were added by cannula to the flask. Additional tetrahydrofuran (20 mL) was added by cannula to the addition funnel to dilute the borane. The reaction was allowed to stir at room temperature for 24 hours. The solution was then Shlenk filtered, the supernatant flask was removed from the system, sealed with a septum and purged with argon. Ethyl acetate was used to quench the filtrate because the reaction of lithium aluminum hydride with ethyl acetate does not form hydrogen. The ethyl acetate slurry that was made was then added slowly to a mixture of water and methanol to ensure that any hydride was fully consumed.

Formation of tripyl borane: A 500 mL three-neck round bottom flask, magnetic stirrer, addition funnel, and Shlenk filter with flask were assembled hot and allowed to cool to room temperature under argon purge. A solution of lithium trihydrotripyl borane in tetrahydrofuran/pentane from the previous step was transferred by cannula to the flask. Chlorotrimethylsilane (2.100 g, 2.44 mL, 19.33 mmol) was then added by syringe to the addition funnel and added dropwise to the borane solution. The reaction was stirred an additional 3 hours and the solvents were then removed by rotary evaporation. Next, ether was added by cannula to the solid, dissolving the product and leaving behind a white powder (lithium chloride). The ether solution was separated from the salt by cannula. The solvent was then removed by rotary evaporation, leaving behind a white crystalline material. Proton NMR confirmed the formation of the desired product because of the disappearance of methoxy peaks.

Polymerization of Poly(1,4-diethynylbenzene tripylborane)

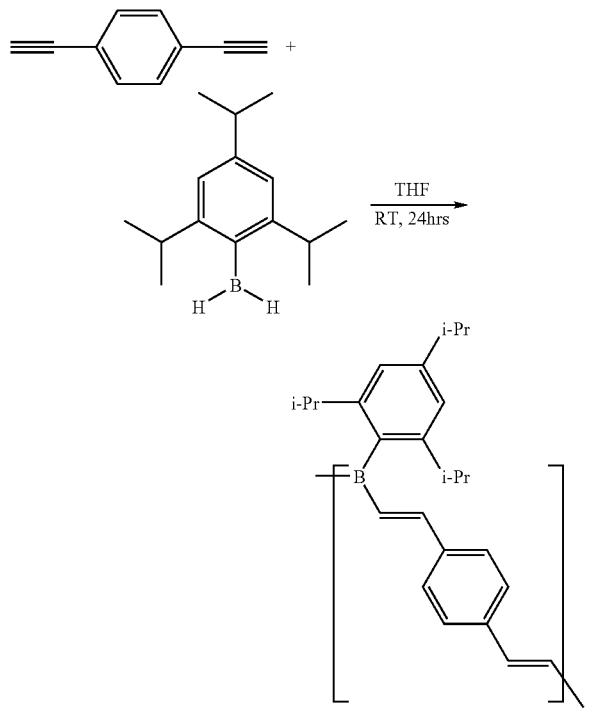

A 100 mL three-neck round bottom flask, magnetic stirrer, condenser, and addition funnel were assembled hot and allowed to cool to room temperature under argon purge. Once cool, 1,4-diethynylbenzene (0.3680 g, 2.917 mmol) was added to the flask and the system was purged an additional 25 minutes. Once the system was properly purged, tetrahydrofuran (30 mL) was transferred by cannula to the flask. The addition of tetrahydrofuran to the diyne caused the solution to turn clear yellow. Next, the previously synthesized tripyl borane (0.6312 g, 2.917 mmol) was dissolved in 5 mL THF and then transferred to an addition funnel where it was then added dropwise to the diyne solution. The reaction was allowed to stir at room temperature overnight and turned from a clear yellow solution to a cloudy amber solution during this time. The solution was then added dropwise to an excess of methanol (500 mL), causing the formation of a yellow precipitate. The precipitate was removed by filtration and then dissolved in a minimal amount of chloroform (approximately 10 mL). The chloroform solution was subjected to the same precipitation/filtration procedure. Proton NMR confirmed the formation of the desired product.

Characterization. The product of the reaction was a bright yellow powdery solid with a strong blue fluorescence when irradiated with long wave UV light (365 nm). It was somewhat soluble in THF, chloroform and chlorobenzene. Solubility in chlorobenzene was 3 g/L or higher. Combined results from ultraviolet photoemission spectroscopy (UPS) and UV-Visible Spectroscopy indicated that this end-capped organoboron polymer had the highest occupied molecular orbital (HOMO) at an energy of −6.7 eV compared to the energy of the vacuum and the lowest unoccupied molecular orbital (LUMO) at an energy of −4.1 eV compared to the energy of the vacuum. The polymer bandgap was determined to be 2.62 eV by UV-Vis spectroscopy.

Photoluminescence quenching (PLQ) studies were performed in order to investigate the use of this polymer as an electron acceptor in a photovoltaic device. In PLQ the p-type semiconductor is excited by irradiation with light of opportune wavelength. In the absence of an electron acceptor, the relaxation from this excited state results in a measurable emission of light. However, if the semiconductor is mixed with an electron acceptor (i.e. the n-type semiconductor) the excited state decays by transferring an electron to the n-type material and no light is generated. The reduction of light emitted (quenching) gives a quantitative measure of the ability of that n-type material to accept electrons from that p-type semiconductor.

Films of the polymer blended with MDMO-PPV (poly[2-methoxy-5-(3,7-dimethyloctyloxy)-1,4-phenylenevinylene)]) were fabricated from the chlorobenzene solution at a blend ratio of 1:1. The PL spectra of the blends were compared to a control sample in which MDMO-PPV was blended with PMMA (Poly(methyl methacrylate), (also 1:1). This was done to give similar optical densities of the test and control films. The ratio of the intensities of the normalized PL emission spectra from the test and control samples corresponds to the efficiency of quenching by the n-type polymer. The films were optically pumped at 530 nm, which is near the peak absorption of the MDMO-PPV (~510 nm). The quenching efficiency of the polymer was 83%.

Thin-film organic photovoltaic fabrication. A photovoltaic device was made by blending this organoboron polymer with the donor semiconducting polymer poly[2-methoxy-5-(3,7-dimethyloctyloxy)-1,4-phenylenevinylene] ($OC_1C_{10}$-PPV), 3:1 by weight. The mixture was dissolved in chlorobenzene at 6 mg/mL and spin coated at 1000 rpm. ITO/PEDOT:PSS was used as the positive electrode, and Ca/Al was used as the negative electrode. The device was illuminated under AM 1.5 and it generated a small photocurrent with open circuit voltage ranging from ranging from 640 mV and efficiency of 0.005%.

Example 10

End Capped Poly(diethynylbenzene tripylborane)

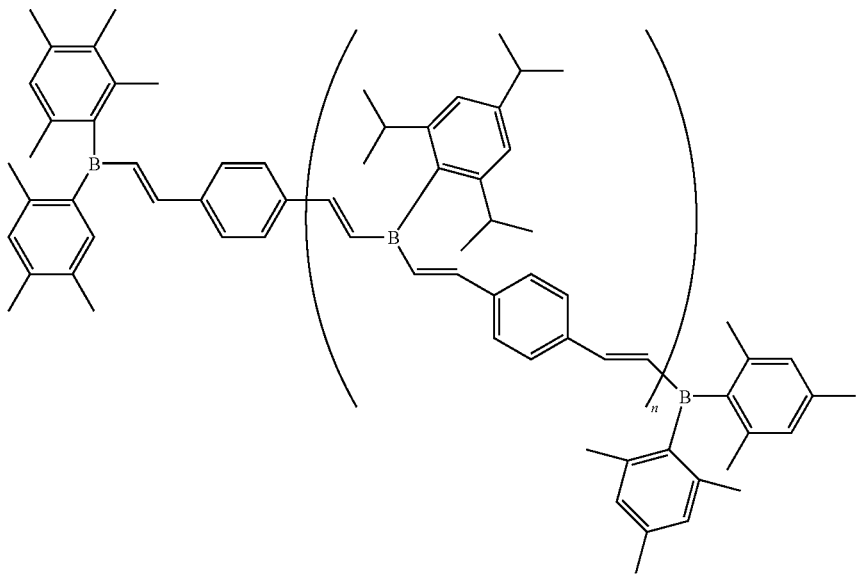

Tripyl borane was synthesized as described in Example 9. Poly(diethynylbenzene tripylborane) was prepared as described in Example 9. Before dimesitylborane was added to the reaction mixture. The reaction was allowed to stir another night at room temperature. The solution was then added dropwise to an excess of methanol (500 mL), causing the formation of a yellow precipitate. The precipitate was removed by filtration and then dissolved in a minimal amount of chloroform (approximately 10 mL). The chloroform solution was subjected to the same precipitation/filtration procedure four times. Proton NMR spectrum confirmed the formation of the desired product. The product had a solubility in chlorobenzene of at least 10 g/L.

Example 11

Poly(9,9-dioctyl-2,7-dipropynyl-9H-fluorene tripylborane)

Tripyl borane was synthesized as described in Example 9.

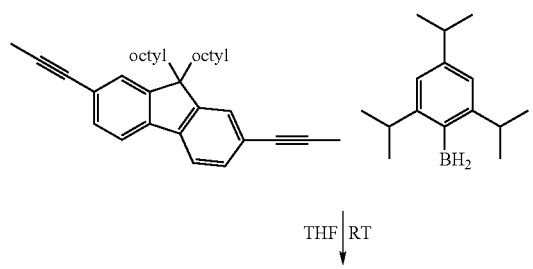

-continued

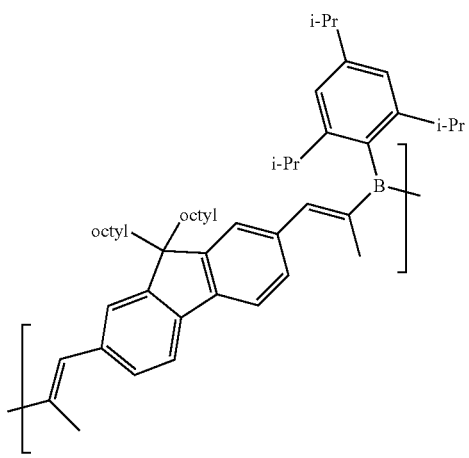

A 100 mL three-neck round bottom flask, magnetic stirrer, condenser, and addition funnel were assembled hot and allowed to cool to room temperature under argon purge. Once cool, 9,9-dioctyl-2,7-dipropynyl-9H-fluorene (1.3669 g, 2.929 mmol) was added to the flask and the system was purged an additional 25 minutes. Once the system was properly purged, tetrahydrofuran (60 mL) was transferred by cannula to the flask. The addition of tetrahydrofuran to the diyne caused the solution to turn clear yellow. Next, the previously synthesized tripyl borane (0.6331 g, 2.929 mmol) was quickly weighed and transferred to an argon-purged vial. The vial was resealed and purged with argon an additional 20 min. Next, tetrahydrofuran (approximately 5 mL) was added by cannula to the vial and allowed to dissolve the borane. The borane-THF solution was then transferred by syringe to the addition funnel where it was then added dropwise to the diyne solution. The reaction was allowed to stir at room temperature overnight and turned from a clear yellow solution to a clear green solution during this time. The reaction was allowed to stir an additional 24 hours and became an even stronger green color. The solution was added dropwise to an excess of methanol (500 mL), causing the formation of a green precipitate. The precipitate was removed by decantation/centrifugation and was then dissolved in a minimal amount of chloroform (approximately 10 mL). The chloroform solution was subjected to the same precipitation/centrifugation procedure. The green product was then analyzed using proton NMR.

Characterization. The product of the reaction was a light green powdery solid with a strong purple-blue fluorescence when irradiated with long wave UV light (365 nm). It was somewhat soluble in THF, chloroform and chlorobenzene. THF solutions were transparent dark green in color when under a diffuse fluorescent light and opaque dark red in color when under a focused light from an incandescence light bulb. Solubility in chlorobenzene was 3 g/L or higher.

Photoluminescence quenching (PLQ) studies were performed in order to investigate the use of this polymer as an electron acceptor in a photovoltaic device.

Films of the polymer blended with MDMO-PPV were fabricated from the Cl-benzene solution at a blend ratio of 1:1. The PL spectra of the blends were compared to a control sample in which MDMO-PPV was blended with PMMA (also 1:1). The films were optically pumped at 530 nm, which is near the peak absorption of the MDMO-PPV (~510 nm). The quenching efficiency of the polymer was 58%.

Thin-film organic photovoltaic fabrication. A photovoltaic device was made by blending this organoboron polymer with the donor semiconducting polymer poly[2-methoxy-5-(3,7-dimethyloctyloxy)-1,4-phenylenevinylene] (OC$_1$C$_{10}$-PPV), 3:1 by weight. The mixture was dissolved in chlorobenzene at 6 mg/mL and spin coated at 1000 rpm. ITO/PEDOT:PSS was used as the positive electrode, and Ca/Al was used as the negative electrode. The device was illuminated under AM 1.5 and it generated a small photocurrent with open circuit voltage ranging from ranging from 920 mV and efficiency of 0.0015%.

Example 12

Poly(diethynylbenzene 4-hexylphenylborane)

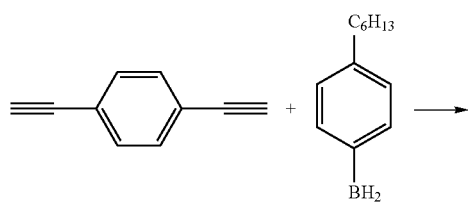

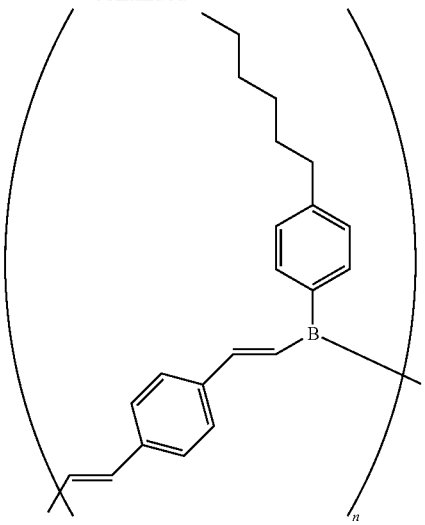

4-Hexylphenylborane was prepared from 1-bromo-4-hexylbenzene with a similar method as described in Example 9 for triply borane. 1,4-Diethynylbenzene (3 mmol) was added to a 100 mL round-bottom flask under inert atmosphere and dissolved in tetrahydrofuran (30 mL). The addition of tetrahydrofuran to the diyne caused the solution to turn clear yellow. Next, the previously synthesized 4-hexylphenylborane (3 mmol) was dissolved in 5 mL THF and then transferred to an addition funnel where it was then added dropwise to the diyne solution. The reaction was allowed to stir at room temperature overnight. The solution was then added dropwise to an excess of methanol (500 mL), causing the formation of a precipitate. The precipitate was removed by filtration and then dissolved in a minimal amount of chloroform (approximately 10 mL). The chloroform solution was subjected to the same precipitation/filtration procedure. Proton NMR spectrum confirmed the formation of the desired product.

Example 13

End Capped Poly(bithiophene 4-hexylphenylborane)

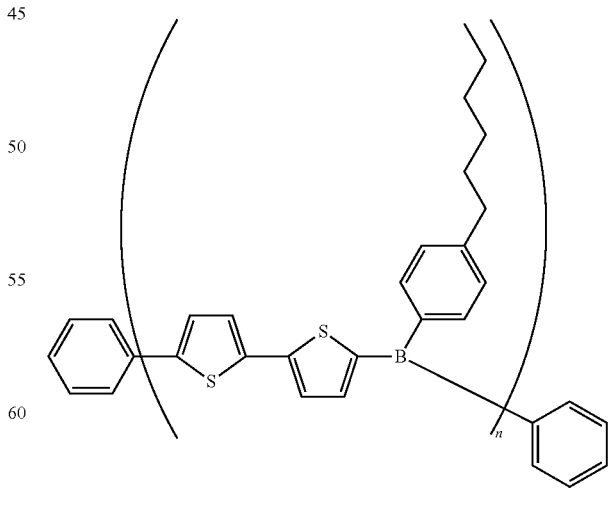

4-Hexylphenyldimethoxy borane was prepared from 1-bromo-4-hexylbenzene with a similar method as described in Example 8 for mesityl borane. To a clean dry round bottom flask, the 4-hexylphenyldimethoxy borane (3.8 mmol, 1 eq.), the commercially available 2,2'-dibromo-bithiophne (3.8 mmol, 1 eq.) and activated magnesium flakes (8.4 mmol, 2.2 eq.) were added to 25 cm³ of anhydrous THF. The reaction was allowed to reflux for a minimum of 72 hours. Color change and fluorescence generally indicated the positive progress of the reaction. After 72 hours bromobenzene was added to the reaction mixture and the reaction was allowed to reflux for additional 2 hrs.

The product was poured in diethylether and the supernatant was decanted under inert atmosphere. The polymer was then crashed with a nonprotic polar solvent and redissolved in ethyl ether.

We claim:

1. End-capped organoboron polymers having the following structures:

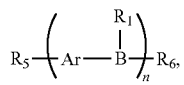

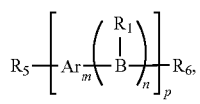

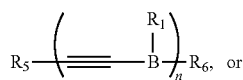

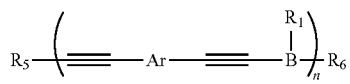

e)

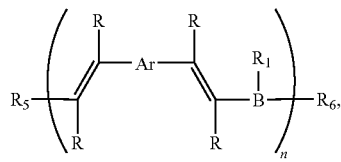

wherein:
Ar is an optionally substituted divalent aromatic radical;
n, m and p are integers indicating either the number of moieties present in a given repeating unit or the average degree of polymerization dependent upon the structure and wherein n, m and p are selected such that the average degree of polymerization of the polymer is 2 or more;
$R_1$ is an optionally substituted aliphatic, alicyclic or aromatic radical; and
$R_5$ and $R_6$, independently of one another, are non-reactive end groups, wherein $R_5$ and $R_6$ are end groups other than hydrogen, hydroxyl, alkoxide halogen, metals, or carbon-carbon multiple bonds.

2. The end capped polymer of claim 1 wherein Ar is selected from 1,4 phenylene, 1,3-phenylene, 1,2-phenylene, and divalent radicals resulting from the removal of two hydrogens from an aromatic species selected from the group consisting of naphthalene, anthracene, tetracene, pentacene, pyrene, perylene, phenanthrene, coronene, diphenyl, pyridine, pyrimidine, triazine, pyrrole, N-alkylpyrroles, N-substituted pyrroles, 3-substituted pyrroles, furan, tetrazole, indole, purine, oxadiazole, quinoxaline, phenazine, N,N'-dialkylphenazines, phenothiazine, N-alkylphenothiazines, carbazole, N-alkylcarbazoles, thiophene, 3-alkylthiophenes, 3-substituted thiophenes, 3,4-disubstituted thiophenes, thienothiophene, substituted thienothiophenes, bithiophene, terthiophene, quaterthiophene, dialkyloxybenzenes, oxadiazole, fluorene, and 9,9-dialkylfluorene, all of which are optionally substituted.

3. The end capped polymer of claim 1 wherein Ar is a divalent radical resulting from the removal of two hydrogen atoms from benzene, thiophene, 3-alkylthiophenes, bithiophene, terthiophene, quaterthiophene, dialkyloxybenzene, fluorene, 9,9-dialkylfluorenes and derivatives thereof.

4. The end capped polymer of claim 1 wherein Ar is a divalent radical of an oligomer having the structure $-(A)_q-$ where A is a divalent aromatic radical and q is an integer ranging from 1-10.

5. The end capped polymer of claim 4 wherein A is selected from 1,4 phenylene, 1,3-phenylene, 1,2-phenylene, and divalent radicals resulting from the removal of two hydrogens from an aromatic species selected from the group consisting of naphthalene, anthracene, tetracene, pentacene, pyrene, perylene, phenanthrene, coronene, diphenyl, pyridine, pyrimidine, triazine, pyrrole, N-alkylpyrroles, N-substituted pyrroles, 3-substituted pyrroles, furan, tetrazole, indole, purine, oxadiazole, quinoxaline, phenazine, N,N'-dialkylphenazines, phenothiazine, N-alkylphenothiazines, carbazole, N-alkylcarbazoles, thiophene, 3-alkylthiophenes, 3-substituted thiophenes, 3,4-disubstituted thiophenes, thienothiophene, substituted thienothiophenes, dialkyloxybenzenes, oxadiazole, fluorene, and 9,9-dialkylfluorene, all of which are optionally substituted.

6. The end capped polymer of claim 4 wherein A is selected from 1,4 phenylene, 1,3-phenylene, 1,2-phenylene, and divalent radicals resulting from the removal of two hydrogens from an aromatic species selected from the group consisting of pyridine, pyrimidine, triazine, pyrrole, N-alkylpyrroles, N-substituted pyrroles, 3-substituted pyrroles, furan, tetrazole, indole, purine, thiophene, 3-alkylthiophenes, 3-substituted thiophenes, 3,4-disubstituted thiophenes, thienothiophene, substituted thienothiophenes, dialkyloxybenzenes, and oxadiazole, all of which are optionally substituted.

7. The end capped polymer of claim 1 wherein n is 3 to 10.

8. The end capped polymer of claim 1 wherein n is 6 to 10.

9. The end capped polymer of claim 1 wherein $R_1$ has formula X:

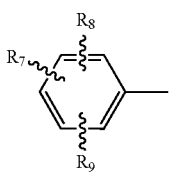

where $R_7$, $R_8$ and $R_9$ represent one or multiple substituents on the indicated ring;

$R_7$ is an organic radical having 1-20 carbon atoms, which may optionally comprise one or more oxygen, sulfur or nitrogens and are optionally substituted by one or more functional group or $R_7$ is an oligomer or a polymer of ethylene glycol or propylene glycol, which may optionally be terminated or substituted by an alkyl radical and $R_8$ and $R_9$ are selected from hydrogen, deuterium, fluorine, halogen, a functional group or an organic radical having from 1-20 carbon atoms wherein two or more of $R_7$, $R_8$ and $R_9$ can be linked together to form a ring having at least 5 ring atoms.

10. An end-capped organoboron polymer of claim 1 which is soluble in an organic solvent useful for making thin films at a level of 10 g/L or more.

11. A thin film comprising an organoboron polymer of claim 1.

12. A thin film of claim 11 in combination with a p-type conducting polymer or an n-type conducting polymer other than a pi-conjugated organoboron polymer.

13. A thin film comprising an organoboron polymer of claim 11 in combination with a p-type conducting polymer.

14. The thin film of claim 11 wherein the organoboron polymer represents from about 1% to about 99% by weight of the thin film.

15. A thin film, organic polymer electronic device which comprises at least one active layer containing a first thin film of a pi-conjugated organoboron polymer of claim 11 and at least two electrodes in contact with the active layer.

16. A thin film, organic polymer electronic device which comprises at least one active layer containing a first thin film of a pi-conjugated organoboron polymer of claim 11 and at least two electrodes in contact with the active layer.

17. The device of claim 16 wherein the first thin film of the pi-conjugated organoboron polymer is 100 angstroms to 10000 angstroms in thickness.

18. The device of claim 16 that exhibits current rectification or diode-like properties.

19. The device of claim 16 wherein the first thin film of a pi-conjugated organoboron polymer emits light under a voltage bias.

20. The device of claim 16 wherein the active layer of the device contains a second thin film containing a light-emitting polymer that is not a pi-conjugated organoboron polymer.

21. The device of claim 16 wherein the device contains a second thin film containing a light-emitting non-polymeric molecule.

22. The device of claim 16 wherein the first thin film comprises a pi-conjugated organoboron polymer blended with a light-emitting non-polymeric molecule.

23. The device of claim 16 wherein the first thin film comprises a pi-conjugated organoboron polymer blended with an organic or inorganic conducting or semiconducting material.

24. The device of claim 16 wherein the first thin film comprises a p-type conducting or semiconducting polymer blended with a pi-conjugated organoboron polymer.

25. The device of claim 16 wherein the first thin film comprises an inorganic p-type semiconducting particles mixed with a pi-conjugated organoboron polymer.

26. The device of claim 25 wherein the inorganic p-type semiconducting particles have at least one dimension less than 1000 angstroms.

27. The device of claim 16 wherein the active layer comprises a second thin film of a dielectric material wherein the second thin film is in contact with one or more additional electrodes.

28. The end capped polymer of claim 1 having structure

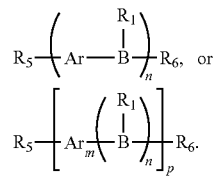

29. The end-capped polymer of claim 1 wherein the average degree of polymerization of the polymer is 3 or more.

30. The end capped polymer of claim 1 wherein $R^5$ and $R^6$ are selected from the group consisting of linear or branched alkyl groups, perfluorinated alkyls, phenyl, perfluorophenyl, alkylphenyl, naphthyl, alkylnaphthyl, naphthalenyl, alkylnaphthalenyl, anthracenyl, alkylanthracenyl, tetracenyl, alkyltetracenyl, pentacenyl, thienyl, alkylthienyl, N-alkylpyrrolyl, fluorenyl, pyridinyl, furanyl, furfuryl, thenyl, pyridyl, pyrazinyl, pyrimidyl, diphenylborane, ditolylborane, bis(alpine)borane, bis(dialkylamino)borane, di(alkoxyphenyl)borane, di(clholorphenyl)borane, di(perflurophenyl)borane, dicyclohexylborane, dicyclopentylborane, di(mesythylborane), di(trypil)borane, or 9-borabicyclo[3.3.1]nonane, each of which is optionally substituted.

31. The end capped polymer of claim 30 wherein $R^1$ is an optionally substituted phenyl ring.

32. The end capped polymer of claim 1 wherein $R^5$ and $R^6$ are optionally substituted phenyl groups.

33. The end capped polymer of claim 32 wherein $R^1$ is an optionally substituted phenyl ring.

34. The end capped polymer of claim 1 wherein $R^5$ and $R^6$ are alkyl substituted phenyl groups.

35. The end capped polymer of claim 34 wherein $R^1$ is selected from pentafluorophenyl, di(trifluoromethyl)phenyl, thexyl, 2-ethylhexyl, pentafluorophenyl, di(trifluoromethyl)phenyl, 1,3,5-trimethylphenyl (mesityl), and 1,3,5-triisopropylphenyl (tripyl) groups.

36. The end capped polymer of claim 1 wherein $R^1$ is selected from pentafluorophenyl, di(trifluoromethyl)phenyl, thexyl, 2-ethylhexyl, pentafluorophenyl, di(trifluoromethyl)phenyl, 1,3,5-trimethylphenyl (mesityl), and 1,3,5-triisopropylphenyl (tripyl) groups.

37. The end capped polymer of claim 1 wherein $R^1$ is selected from 1,3,5-trimethylphenyl (mesityl) or 1,3,5-triisopropylphenyl (tripyl) groups.

38. The end capped polymer of claim 1 wherein Ar is a divalent radical resulting from the removal of two hydrogens from an aromatic species selected from thiophene, 3-alkylthiophenes, 3-substituted thiophenes, 3,4-disubstituted thiophenes, thienothiophene, substituted thienothiophenes, bithiophene, terthiophene, or quaterthiophene.

39. The end capped polymer of claim 1 having the structure:

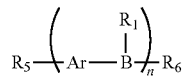

wherein $R^5$ and $R^6$ are selected from the group consisting of linear or branched alkyl groups, perfluorinated alkyls, phenyl, perfluorophenyl, alkylphenyl, naphthyl, alkylnaphthyl, naphthalenyl, alkylnaphthalenyl, anthracenyl, alkylanthracenyl, tetracenyl, alkyltetracenyl, pentacenyl, thienyl, alkylthienyl, N-alkylpyrrolyl, fluorenyl, pyridinyl, furanyl, furfuryl, thenyl, pyridyl, pyrazinyl, or pyrimidyl, diphenylborane, ditolylborane, bis(alpine)borane, bis(dialkylamino)borane, di(alkoxyphenyl)borane, di(clholorphenyl)borane, di(perflurophenyl)borane, dicyclohexylborane, dicyclopentylborane, di(mesythylborane), di(trypil)borane, or 9-borabicyclo [3.3.1]nonane, each of which is optionally substituted.

40. The end capped polymer of claim 39 wherein $R^5$ and $R^6$ are alkyl substituted phenyl groups.

41. The end capped polymer of claim 39 wherein $R^5$ and $R^6$ are phenyl, tolyl, alkylphenyl, xylyl, 3,5-dimethylphenyl, 3,5-(diisopropyl)phenyl, pentafluorophenyl, di(trifluoromethyl)phenyl, thexyl, or 2-ethylhexyl groups.

42. The end capped polymer of claim 39 wherein Ar is selected from 1,4 phenylene, 1,3-phenylene, 1,2-phenylene, and divalent radicals resulting from the removal of two hydrogens from an aromatic species selected from the group consisting of naphthalene, anthracene, tetracene, pentacene, pyrene, perylene, phenanthrene, coronene, diphenyl, pyridine, pyrimidine, triazine, pyrrole, N-alkylpyrroles, N-substituted pyrroles, 3-substituted pyrroles, furan, tetrazole, indole, purine, oxadiazole, quinoxaline, phenazine, N,N'-dialkylphenazines, phenothiazine, N-alkylphenothiazines, carbazole, N-alkylcarbazoles, thiophene, 3-alkylthiophenes, 3-substituted thiophenes, 3,4-disubstituted thiophenes, thienothiophene, substituted thienothiophenes, bithiophene, terthiophene, quaterthiophene, dialkyloxybenzenes, oxadiazole, fluorene, and 9,9-dialkylfluorene, all of which are optionally substituted.

43. The end capped polymer of claim 39 wherein Ar is a divalent radical resulting from the removal of two hydrogens from an aromatic species selected from thiophene, 3-alkylthiophenes, 3-substituted thiophenes, 3,4-disubstituted thiophenes, thienothiophene, substituted thienothiophenes, bithiophene, terthiophene, or quaterthiophene.

44. The end capped polymer of claim 39 wherein Ar is a divalent radical of an oligomer having the structure -(A)$_q$- where q is an integer ranging from 1-10 and A is thiophene, 3-alkylthiophene, 3-substituted thiophene, or 3,4-disubstituted thiophene.

45. The end capped polymer of claim 44 wherein $R^5$ and $R^6$ are phenyl, tolyl, alkylphenyl, xylyl, 3,5-dimethylphenyl, 3,5-(diisopropyl)phenyl, pentafluorophenyl, di(trifluoromethyl)phenyl, thexyl, or 2-ethylhexyl groups.

46. The end capped polymer of claim 45 wherein $R^1$ is selected from pentafluorophenyl, di(trifluoromethyl)phenyl, thexyl, 2-ethylhexyl, pentafluorophenyl, di(trifluoromethyl)phenyl, thexyl, 2-ethylhexyl, 1,3,5-trimethylphenyl (mesityl), and 1,3,5-triisopropylphenyl (tripyl) groups.

47. The end capped polymer of claim 39 wherein $R_1$ has formula X:

where $R_7$, $R_8$ and $R_9$ represent one or multiple substituents on the indicated ring;

$R_7$ is an organic radical having 1-20 carbon atoms, which may optionally comprise one or more oxygen, sulfur or nitrogens and are optionally substituted by one or more functional group or $R_7$ is an oligomer or a polymer of ethylene glycol or propylene glycol, which may optionally be terminated or substituted by an alkyl radical and $R_8$ and $R_9$ are selected from hydrogen, deuterium, fluorine, halogen, a functional group or an organic radical having from 1-20 carbon atoms wherein two or more of $R_7$, $R_8$ and $R_9$ can be linked together to form a ring having at least 5 ring atoms.

48. The end capped polymer of claim 39 wherein $R^1$ is selected from pentafluorophenyl, di(trifluoromethyl)phenyl, thexyl, 2-ethylhexyl, pentafluorophenyl, di(trifluoromethyl)phenyl, thexyl, 2-ethylhexyl, 1,3,5-trimethylphenyl (mesityl), and 1,3,5-triisopropylphenyl (tripyl) groups.

49. The end capped polymer of claim 39 wherein:
Ar is a divalent radical of an oligomer having the structure -(A)$_q$- where q is an integer ranging from 1-10 and A is thiophene, 3-alkylthiophenes, 3-substituted thiophenes, 3,4-disubstituted thiophenes;
$R^1$ is selected from pentafluorophenyl, di(trifluoromethyl)phenyl, thexyl, 2-ethylhexyl, pentafluorophenyl, di(trifluoromethyl)phenyl, thexyl, 2-ethylhexyl, 1,3,5-trimethylphenyl (mesityl), or 1,3,5-triisopropylphenyl (tripyl) groups; and
$R^5$ and $R^6$ are the same group and are selected from phenyl, tolyl, alkylphenyl, xylyl, 3,5-dimethylphenyl, 3,5-(diisopropyl)phenyl, pentafluorophenyl, di(trifluoromethyl)phenyl, thexyl, or 2-ethylhexyl groups.

50. The end capped polymer of claim 39 wherein:
Ar is a divalent radical of an oligomer having the structure -(A)$_q$- where q is an integer ranging from 1-10 and A is thiophene,
$R^1$ is selected from 1,3,5-trimethylphenyl (mesityl), or 1,3,5-triisopropylphenyl (tripyl) groups; and
$R^5$ and $R^6$ are the same group and are selected from 3,5-dimethylphenyl, or 3,5-(diisopropyl)phenyl groups.

51. The end capped polymer of claim 50 wherein n is 3 to 10.

52. The end capped polymer of claim 39 having the structure:

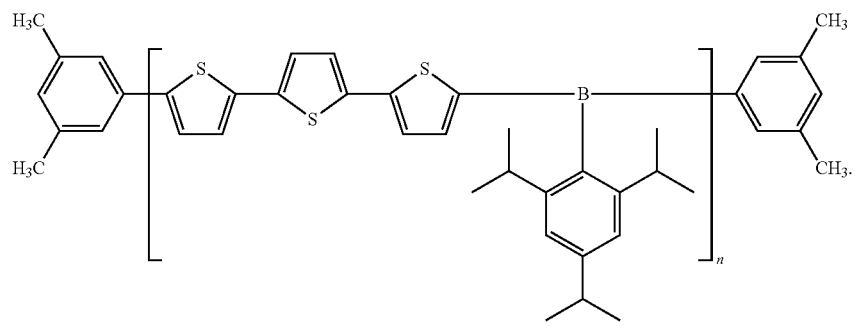
53. The end capped polymer of claim 52 wherein n is 3 to 10.